(12) United States Patent
Park et al.

(10) Patent No.: US 9,418,893 B2
(45) Date of Patent: Aug. 16, 2016

(54) ORGANIC ELECTROLUMINESCENT DEVICE AND METHOD FOR FABRICATING THE SAME

(71) Applicant: LG DISPLAY CO., LTD., Seoul (KR)

(72) Inventors: Kyoung Jin Park, Paju-si (KR); Ki Soub Yang, Paju-si (KR); Dae Jung Choi, Paju-si (KR); Seung Ryul Choi, Goyang-si (KR); Han Hee Kim, Anseong-si (KR); Kang Hyun Kim, Gyeongju-si (KR); Ji Hyun Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 210 days.

(21) Appl. No.: 14/139,368

(22) Filed: Dec. 23, 2013

(65) Prior Publication Data
US 2015/0333110 A1  Nov. 19, 2015

(30) Foreign Application Priority Data

Aug. 30, 2013 (KR) ........................ 10-2013-0104356

(51) Int. Cl.
*H01L 27/00* (2006.01)
*H01L 21/77* (2006.01)
*H01L 51/56* (2006.01)
*H01L 27/32* (2006.01)

(52) U.S. Cl.
CPC ............ *H01L 21/77* (2013.01); *H01L 27/3244* (2013.01); *H01L 27/3246* (2013.01); *H01L 27/3248* (2013.01); *H01L 27/3258* (2013.01); *H01L 27/3262* (2013.01); *H01L 51/56* (2013.01); *H01L 2227/323* (2013.01)

(58) Field of Classification Search
CPC ............ H01L 27/3246; H01L 27/3244; H01L 27/3262; H01L 27/3258; H01L 27/3248
See application file for complete search history.

(56) References Cited

U.S. PATENT DOCUMENTS

| | | | | |
|---|---|---|---|---|
| 2011/0114956 A1* | 5/2011 | Park | ..................... | H01L 27/3248 257/59 |
| 2011/0127500 A1* | 6/2011 | Ko | ....................... | H01L 27/3211 257/40 |
| 2013/0048201 A1* | 2/2013 | Lee | ......................... | H01L 51/56 156/192 |
| 2014/0183465 A1* | 7/2014 | Jeong | .................. | H01L 51/5237 257/40 |
| 2015/0021560 A1* | 1/2015 | Jeong | ..................... | H01L 51/56 257/40 |
| 2015/0028295 A1* | 1/2015 | Choi | ....................... | H01L 51/56 257/40 |

\* cited by examiner

*Primary Examiner* — Ngan Ngo
(74) *Attorney, Agent, or Firm* — Dentons US LLP

(57) ABSTRACT

Disclosed an organic electroluminescent device and a method for fabricating the same. The device may include a thin film transistor disposed on a substrate; a first electrode formed for each pixel on the thin film transistor; a first pixel define layer formed to cover an edge portion of the first electrode; a second pixel define layer formed on the first pixel define layer; an organic layer formed on the first electrode; and a second electrode formed on the organic layer.

12 Claims, 22 Drawing Sheets

ORGANIC ELECTROLUMINESCENT DEVICE AND METHOD FOR FABRICATING THE SAME

CROSS-REFERENCE TO RELATED APPLICATIONS

This application claims the benefit of Korean Patent Application No. 10-2013-0104356, filed on Aug. 30, 2013, which is hereby incorporated by reference for all purposes as if fully set forth herein.

BACKGROUND OF THE INVENTION

1. Field of the Invention

The present invention relates to an organic electroluminescent device (hereinafter, referred to as an "OLED"). More particularly, the present invention relates to an organic electroluminescent device capable of suppressing the spread of ink during the formation of an organic layer using a soluble process to enhance the light-emitting uniformity of a pixel, and a method for fabricating the same.

2. Discussion of the Related Art

As a core technology in the information communication era, image display devices for implementing various information on a screen thereof have been developed in the direction of high performance while allowing thinner, lighter and portable devices.

As a flat display device capable of reducing the weight and volume, which are the drawbacks of CRTs, an organic electroluminescent device or the like for controlling the light-emitting amount of an organic layer to display an image has been widely used.

The organic light emitting device (OLED) is a spontaneous light-emitting device using a thin light-emitting layer between electrodes, thereby having an advantage of thinning such as a paper.

The organic light emitting device (OLED) having such characteristics may be largely divided into an active matrix OLED (AM-OLED) and a passive matrix OLED (PM-OLED). Here, for the passive matrix OLED (PM-OLED), pixels comprised of 3-color (R, G, B) sub-pixels are arranged in a matrix form to display an image.

Each sub-pixel may include an organic light emitting device and a cell driver for driving the organic light emitting device. The cell driver is configured with a gate line for supplying a scan signal, a data line for supplying a video data signal, and at least two thin film transistors and storage capacitors connected between common power lines for supplying a common power signal to drive an anode of the organic light emitting device.

The organic light emitting device may include an anode, a hole injection layer (HIL), a hole transport layer (HTL), a light-emitting layer, an electron transport layer (ETL), an electron injection layer (EIL), and a cathode.

In particular, the hole injection layer (HIL), hole transport layer (HTL), electron transport layer (ETL) and electron injection layer (EIL) are formed through a soluble process.

Here, when the hole injection layer (HIL), hole transport layer (HTL), electron transport layer (ETL) and electron injection layer (EIL) are formed through the soluble process, a phenomenon such as the spread of solution or the like may be generated, thereby causing a non-uniform thickness of the layers.

From such a point of view, an organic light emitting device according to the related art using a soluble process will be described below with reference to FIGS. 1 and 2.

FIG. 1 is a schematic cross-sectional view illustrating an organic light emitting device according to the related art.

FIG. 2 is a schematic cross-sectional view during the formation of an organic layer according to the related art.

Referring to FIG. 1, a buffer layer (not shown) formed of an insulation material, for example, silicon oxide ($SiO_2$) or silicon nitride (SiNx), which is an inorganic insulation material, is provided on the substrate 11, and a semiconductor layer 13 comprised of a first region 13a forming a channel and second regions 13b, 13c in which a high concentration of impurities are doped on both lateral surfaces of the first region 13a is formed at each pixel region (P) within the display area (AA) at an upper portion of the buffer layer (not shown).

A gate insulating layer 15 is formed on the buffer layer (not shown) including the semiconductor layer 13, and the drive region (not shown) and switching region (not shown) are provided on the gate insulating layer 15, and thus a gate electrode 17 is formed to correspond to the first region 13a of each of the semiconductor layer 13.

Furthermore, a gate line (not shown) connected to a gate electrode 17 formed in the switching region (not shown) and extended in one direction is formed on the gate insulating layer 15.

On the other hand, an interlayer insulating layer 19 is formed on an entire surface of the display area at an upper portion of the gate electrode 17 and gate line (not shown). Here, a semiconductor layer contact hole (not shown) for exposing the second regions 13b, 13c, respectively, located at both lateral surfaces of the first region 13a of each of the semiconductor layer, is provided on the interlayer insulating layer 19 and the gate insulating layer 15 at a lower portion thereof.

Furthermore, a data line (not shown) crossed with a gate line (not shown) to define the pixel region (P) and formed of a second metal material, and a power line (not shown) separated therefrom are formed at an upper portion of the interlayer insulating layer 19 including the semiconductor layer contact hole (not shown). Here, the power line (not shown) may be formed to be separated from and in parallel to the gate line (not shown) on a layer formed with the gate line (not shown), namely, the gate insulating layer.

In addition, a source electrode 23a and a drain electrode 23b brought into contact with the second regions 13b, 13c separated from each other, and respectively exposed through the semiconductor layer contact hole (not shown) and formed of the same second metal material as that of the data line (not shown) are formed in the each drive region (not shown) and switching region (not shown) on the interlayer insulating layer 19. Here, the semiconductor layer 13 and gate insulating layer 15 sequentially deposited on the drive region (not shown) and the gate electrode 17 and interlayer insulating layer 19 and the source electrode 23a and drain electrode 23b formed to be separated from each other form a thin film transistor (T), for example, a drive thin film transistor.

On the other hand, a planarization layer 25 having a drain contact hole (not shown) for exposing the drain electrode 23b of the thin film transistor (not shown) is formed on the thin film transistor and switching thin film transistor (not shown).

Furthermore, a first electrode 29 brought into contact with drain electrode 23b of the drive thin film transistor (not shown) through the drain contact hole (not shown) and having a separated form for each pixel region (P) is formed on the planarization layer 25. Here, the first electrode 29 is hydrophilic and thus organic materials are well stuck thereto.

In addition, an inorganic material is formed on the first electrode 29, and a pixel define layer 33 for separately forming each pixel region (P). Here, the pixel define layer 33 is located between the adjoining pixel regions (Ps) and in addition, part thereof is located at a panel edge portion. The pixel define layer 33 is hydrophobic and thus organic materials are well gathered only within the pixel, and as a result, the organic materials are well placed on the first electrode 29 subsequent to the drying process.

Organic layers 35 formed of organic materials that emit red, green and blue colors, respectively, are formed on the first electrode 29 within each pixel region (P) surrounded by the pixel define layer 33. Here, the organic layers 35 are formed using a soluble process such as an ink-jet printing method to enhance the pattern accuracy.

Furthermore, a second electrode 37 is formed at an upper portion of the organic layer 35 and pixel define layer 33. Here, the first electrode 29, the second electrode 37, and the organic layer 35 interposed between the two electrodes 29, 37 form an organic light emitting device (E).

However, according to an organic light emitting device according to the related art, a bank is configured with a hydrophobic pixel define layer 33 and a hydrophilic first electrode, and in particular, the first electrode 29 is hydrophilic, and thus organic materials are well stuck thereto, but the organic pixel define layer 33 is hydrophobic and thus organic materials are well gathered only within the pixel, and as a result, the organic materials are well placed on the first electrode 29 subsequent to the drying process.

FIG. 2 is a schematic cross-sectional view during the formation of an organic layer according to the related art.

However, as illustrated in FIG. 2, a thickness (t1) variation of the organic layer 35 is generated within the pixel region (P) while an edge area (A) of the organic layer 35 within a pixel is drawn up a sidewall of the pixel define layer 33 during the drying process of the organic layer 35, thereby causing a failure in the edge region of the pixel. In other words, ink bleeding is generated during the ink-jet printing due to the nature of the ink-jet process, and thus a phenomenon occurs in which ink is piled up at a sidewall, namely, an inclined surface of the pixel define layer 33, thereby deteriorating the thickness uniformity of the organic layer within the pixel.

Accordingly, according to an organic light emitting device in accordance with the related art, an organic layer is formed using a soluble process through an ink-jet printing method, and thus a phenomenon occurs in which ink is piled up at a sidewall of the pixel define layer, and consequently the amount of used ink is increased, thereby increasing the fabrication cost of the organic light emitting device.

Furthermore, according to an organic light emitting device in accordance with the related art, a thickness variation of the organic layer is generated within the pixel region while an edge area of the organic layer within a pixel is drawn up a sidewall of the pixel define layer during the drying process of the organic layer, and thus the thickness uniformity of the organic layer is reduced, thereby deteriorating the light-emitting uniformity of the pixel.

In addition, a dry etch or wet etch process is applied during the formation of the pixel define layer in an organic light emitting device according to the related art, and as a result, a damage occurs on a surface of an ITO layer constituting the first electrode, thereby reducing the lifespan of a soluble OLED.

SUMMARY OF THE INVENTION

The present invention is contrived to solve the problems in the related art, and an object of the present invention is to provide an organic light emitting device and a method of fabricating the same in which a 2-step pixel define layer is applied to minimize a damage on an ITO surface during the formation of the pixel define layer so as to enhance the lifespan of an organic light emitting device (OLED) and a lift-off process is applied during the formation of the 2-step pixel define layer to reduce the number of fabrication processes so as to reduce the fabrication cost.

In order to accomplish the foregoing object, an organic light emitting device may include a thin film transistor disposed on a substrate; a first electrode formed for each pixel on the thin film transistor; a first pixel define layer formed to cover an edge portion of the first electrode; a second pixel define layer formed on the first pixel define layer; an organic layer formed on the first electrode; and a second electrode formed on the organic layer.

In order to accomplish the foregoing object, a method of fabricating an organic light emitting device may include forming a substrate, a semiconductor active layer the substrate, an insulated gate electrode on the semiconductor active layer, and a thin film transistor (TFT) having a source electrode and a drain electrode respectively brought into contact with the semiconductor active layer; forming a transparent conductive layer on an entire surface of the substrate containing the thin film transistor; forming a photoresist pattern on the transparent conductive layer; etching the transparent conductive layer using the photoresist pattern as a mask to form a first electrode electrically connected to the thin film transistor; implementing an ashing process to etch the photoresist pattern so as to expose an upper edge portion of the first electrode; forming an inorganic material layer on an entire surface of the substrate containing the first electrode and photoresist pattern to form a crack on a surface of the inorganic material layer; implementing a lift-off process to remove the photoresist pattern and the inorganic material layer formed at an upper portion of the photoresist pattern so as to form a first pixel define layer that covers an edge portion of the first electrode; forming a second pixel define layer on the first pixel define layer; forming an organic layer on the first electrode; and forming a second electrode on the organic layer.

In order to accomplish the foregoing object, a method of fabricating an organic light emitting device may include forming a semiconductor active layer on a substrate, an insulated gate electrode on the semiconductor active layer, and a thin film transistor having a source electrode and a drain electrode respectively brought into contact with the semiconductor active layer; forming a first electrode electrically connected to the drain electrode of the thin film transistor on an entire surface of the substrate containing the thin film transistor; forming a photoresist pattern having an inverse tapered shape on the first electrode; forming an inorganic material layer on an entire surface of the substrate containing the photoresist pattern; implementing a lift-off process to remove the photoresist pattern and the inorganic material layer formed at an upper portion of the photoresist pattern so as to form a first pixel define layer that covers an edge portion of the first electrode; forming a second pixel define layer on the first pixel define layer; forming an organic layer on the first electrode; and forming a second electrode on the organic layer.

According to an organic light emitting device and a method for fabricating the same in accordance with the present invention, a first pixel define layer may be formed through a lift-off process and thus a dry etching or wet etching process may be omitted to minimize a damage on an ITO surface or lower layer of the first electrode, thereby enhancing the light-emitting uniformity and lifespan of the pixel.

Furthermore, according to an organic light emitting device and a method for fabricating the same in accordance with the present invention, a first pixel define layer may be formed through a lift-off process and thus a dry etching or wet etching process may be omitted to reduce the number of fabrication processes, thereby reducing the fabrication cost.

In addition, according to an organic light emitting device and a method for fabricating the same in accordance with the present invention, a phenomenon in which an edge region on an organic layer within a pixel is drawn up a sidewall of the upper pixel define layer may be alleviated by the pixel define layer at a lower portion thereof during the drying process of an organic layer formed through a soluble process to maintain a thickness (t2) uniformity of the organic layer within the pixel region (P), thereby enhancing the light-emitting uniformity of the pixel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
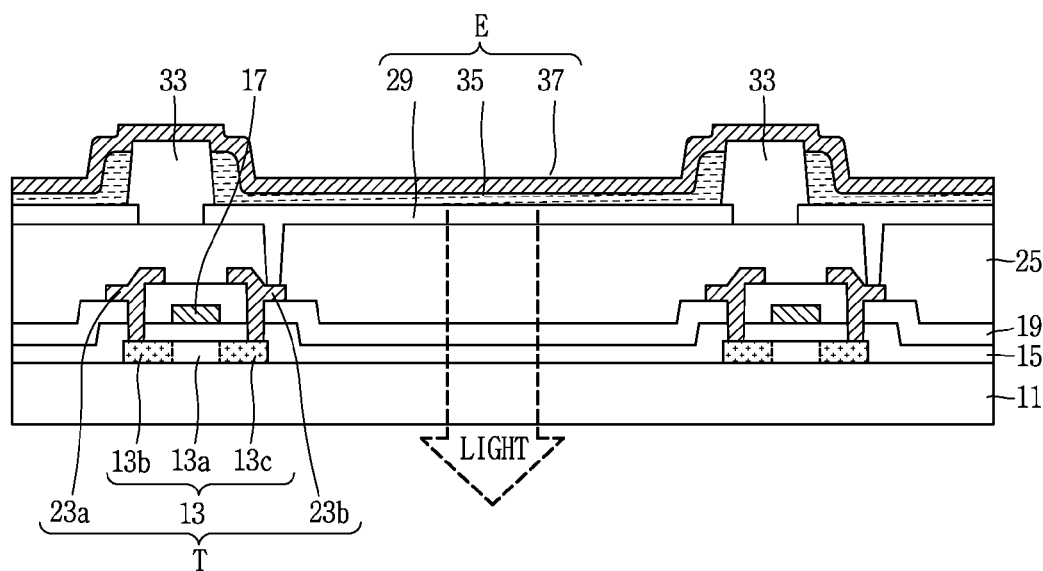
FIG. 1 is a schematic cross-sectional view illustrating an organic light emitting device according to the related art.
Figure 2:
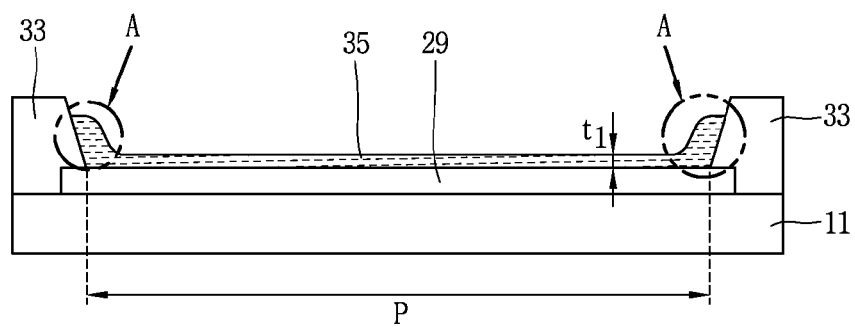
FIG. 2 is a schematically enlarged view illustrating a state in which an edge region on an organic layer within a pixel is drawn up a sidewall of the pixel define layer during the formation of the organic layer, as a schematic cross-sectional view illustrating an organic light emitting device according to the related art.

Hereinafter, an organic light emitting device according to a preferred embodiments of the present invention will be described in detail.

The configuration of the present invention and working effect thereof will be clearly understood by the following detailed description. Prior to the detailed description of the present invention, it should be noted that the same reference numerals are designated to the same constituent element even though they are shown in the other drawings, and the detailed description will be omitted when publicly known configurations to which the invention pertains are judged to obscure the gist of the present invention.

An organic light emitting device according to the present invention is divided into a top emission type and a bottom emission type according to the transmission direction of emitted light, and hereinafter, according to the present invention, the top emission type will be described as an example.

Hereinafter, an organic light emitting device according to a preferred embodiment of the present invention will be described in detail with reference to FIGS. 3 and 4.

Figure 3:
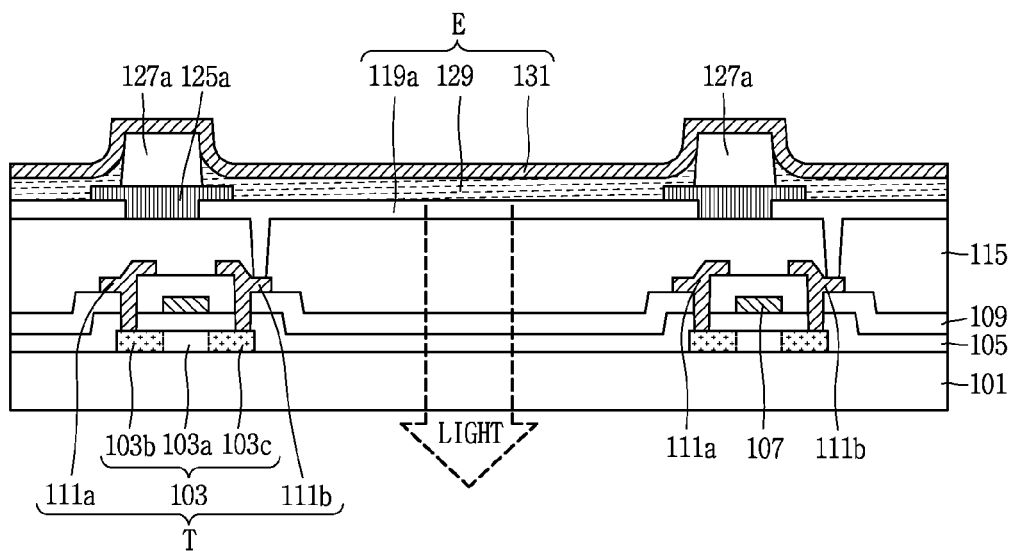
FIG. 3 is a schematic cross-sectional view illustrating an organic light emitting device according to the present invention.

FIG. 3 is a schematic cross-sectional view illustrating an organic light emitting device according to the present invention.

As illustrated in FIG. 3, a buffer layer (not shown) is formed on a substrate 101 with a glass or plastic material, and a thin film transistor (TFT) and an organic light emitting device (E) are formed thereon.

A buffer layer (not shown) is formed on the substrate 101, and an active layer 103 formed with a semiconductor material is provided on the buffer layer. Here, the active layer 103 formed on the substrate 101 may be selected and formed from an inorganic or organic semiconductor, and n-type or p-type impurities are doped in the source region 103b and drain region 103c, and a channel region 103a for connecting between the source region 103b and drain region 103c is provided therein.

An inorganic semiconductor forming the active layer 103 may include CdS, GaS, ZnS, CdSe, ZnSe, CdTe, SiC, and Si. Furthermore, an organic semiconductor forming the active layer 103 may include polythiophene and derivatives thereof, polyparaphenylene vinylene and derivatives thereof, polyparaphenylene and derivatives thereof, polyfluorene and derivatives thereof, polythiophene vinylene and derivatives thereof, polythiophene-heterocyclic aromatic copolymers and derivatives thereof as a high molecular substance, and may include oligoacene of pentacene, tetracene, naphthalene and derivatives thereof, oligothiophene of alpha-6-thiophene, alpha-5-thiophene and derivatives thereof, phthalocyanine containing or not containing a metal and derivatives thereof, pyromellitic dianhydride tick or pyromellitic diimide and derivatives thereof, perylene tetracarboxylic acid dianhydride or perylene tetracarboxylic diimide and derivatives thereof as a small molecular substance.

A gate insulating layer 105 is formed to cover the active layer 103, and a gate electrode 107 is formed at an upper portion of the gate insulating layer 105. Here, the gate electrode 107 is connected to a gate line (not shown) applying an on/off signal of the thin film transistor (T). Here, the gate electrode 107 may be formed of a conductive metal layer such as MoW, Al, Cr, Al/Cu or the like, but may not be necessarily limited to them, and various conductive materials such as a conductive polymer or the like may be used for the gate electrode 107. The gate electrode 107 is formed to cover a region corresponding to the channel region 103a of the active layer 103.

Furthermore, an interlayer insulating layer 109 is formed on an entire surface of the substrate to cover the gate electrode 107, and a source electrode 111a and a drain electrode 111b are formed on the interlayer insulating layer 109. Here, the source electrode 111a and drain electrode 111b are brought into contact with the source region 103b and drain region 103c of the active layer 103 through a contact hole (not shown) formed on the gate insulating layer 105 and interlayer insulating layer 109.

Moreover, a passivation layer 115 made of $SiO_2$, SiNx or the like is formed at an upper portion of the source electrode 111a and drain electrode 111b. Here, the passivation layer 115 may perform the role of a protective layer for protecting the thin film transistor (T), and perform the role of a planarization layer for planarizing the upper surface thereof.

On the other hand, a predetermined opening portion (not shown) is formed on the passivation layer 115, and then a first electrode 119a becoming an anode electrode of the organic light emitting device (E). Here, the first electrode 119a performs the function of an anode electrode, and a second electrode 131 which will be described later performs the function of a cathode electrode, but the first electrode 119a and second electrode 131 may be allowed to have opposite polarities to each other.

The first electrode 119a may be provided with a transparent electrode and a reflective electrode, and thus may be provided with ITO, IZO, ZnO, or $In_2O_3$ when used as a transparent electrode, and a reflective layer may be formed of Ag, Mg, Al, Pt, Pd, Au, Ni, Nd, Ir, Cr, and compounds thereof and then ITO, IZO, ZnO, or $In_2O_3$ may be formed thereon when used as a reflective electrode.

A first pixel define layer 125a made of a hydrophilic inorganic material is formed to cover an edge portion of the first electrode 119a, and a second pixel define layer 127a made of a hydrophobic organic material is formed at an upper portion of the first pixel define layer 125a. Here, the second pixel define layer 127a has a smaller width than that of the first pixel define layer 125a, but is not formed at an upper edge portion of the first pixel define layer 125a.

The first and the second pixel define layer 125a, 127a denote patterned insulating layers performing the role of more accurately defining a light-emitting region in fabricating an organic light emitting device. The pixel define layer in an organic light emitting device in the related art has been typically formed with a single layer made of an organic material, and a deposition method has been typically used in the related art to form an organic layer on the pixel define layer, but according to the present invention, a printing technology such as ink-jet, nozzle printing or the like is used to reduce the mask process and enhance the pattern accuracy.

A soluble material or polymer-based liquid substance is injected between banks formed by the pixel define layer, and dried to form an organic layer during an organic layer patterning process using such a printing technology.

Here, an electron transport layer (ETL), which is a conductive material for connecting a current flow between the light-emitting material and the first electrode 119a, is used for a material initially printed on the first electrode 119a, and typically used a material such as PEDOT or the like.

The substance is a material having properties such as water, and the printing aspect may vary according to the material properties of the pixel define layer. For example, the organic material is widely spread out to be well stuck thereto when the pixel define layer is a hydrophilic substance, whereas the organic material is cohered in a round shape not to be stuck thereto when the pixel define layer is a hydrophobic substance.

According to the present invention, a bank is configured with a first electrode 119a made of a transparent conductive material such as hydrophilic ITO or the like, a first pixel define layer 125a made of a hydrophilic inorganic material, and a second pixel define layer 127a made of a hydrophobic organic material. In other words, the first pixel define layer 125a and first electrode 119a are hydrophilic such that an organic material is well stuck thereto, and the second pixel define layer 127a is hydrophobic such that an organic material is well gathered only within a pixel, and thus the organic material is well placed on the first electrode 119a subsequent to the drying process.

Accordingly, an item occupying the largest proportion of organic layer patterning process failures using a printing technology is an edge failure, and a thickness variation is generated within the organic layer while an edge region of the organic layer within the pixel is drawn up during the drying process of the organic layer while forming a pixel define layer having an existing single structure, thereby causing a failure in the edge region of the pixel.

However, according to the present invention, the first pixel define layer 125a made of an inorganic layer and the second pixel define layer 127a made of an organic layer are formed thereon to prevent a failure in the existing edge region of the pixel, and the first pixel define layer 125a is formed between the first electrodes 119a, and the second pixel define layer 127a is formed on an upper surface excluding an upper edge portion of the first pixel define layer 125a.

Figure 4:
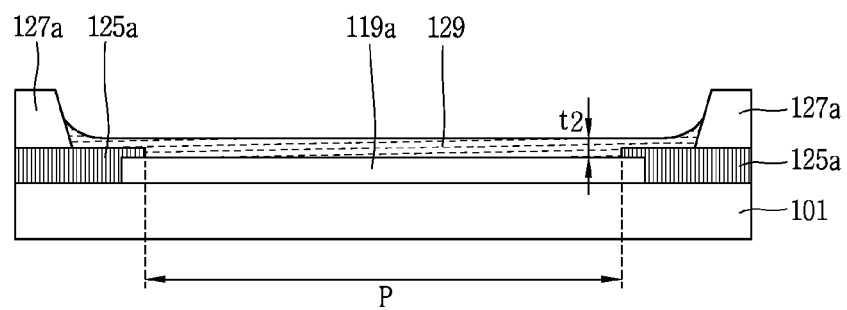
FIG. 4 is a schematically enlarged view illustrating a state in which the shape of an edge region on an organic layer within a pixel being drawn up a sidewall of the pixel define layer is alleviated during the formation of the organic layer, as a schematic cross-sectional view illustrating an organic light emitting device according to the related art.

FIG. 4 is a schematically enlarged view illustrating a state in which the shape of an edge region on an organic layer within a pixel being drawn up a sidewall of the pixel define layer is alleviated during the formation of the organic layer, as a schematic cross-sectional view illustrating an organic light emitting device according to the related art.

As illustrated in FIG. 4, when the organic layer 129 is formed on the first electrode 119a, the first pixel define layer 125a and first electrode 119a are hydrophilic and thus organic materials are well stuck thereto, but the second organic pixel define layer 127a is hydrophobic and thus organic materials are well gathered only within the pixel, and accordingly, the organic materials are well placed on the first electrode 119a subsequent to the drying process, and as a result, a phenomenon in which an edge region on an organic layer within a pixel is drawn up a sidewall of the second pixel define layer 127a may be alleviated by the first pixel define layer 125a at a lower portion thereof during the drying process of the organic layer to maintain a thickness (t2) uniformity of the organic layer within the pixel region (P), thereby enhancing the light-emitting uniformity of the pixel.

On the other hand, a predetermined opening, namely, pixel region (P), is formed on the first pixel define layer 125a, and an organic layer 129 is formed on the first electrode 119a at a lower portion of the opening formed by the first pixel define layer 125a. Here, the organic layer 129 may include a light-emitting layer (not shown). Here, the present invention may not be necessarily limited to such a structure, and various structures of the organic light emitting device may be applicable thereto as they are.

A low or high molecular organic layer may be used for the organic layer 129, and when a low molecular organic layer is used, a hole injection layer (HIL), a hole transport layer (HTL), an emission layer (EML), an electron transport layer (ETL), and an electron injection layer (EIL) and the like may be deposited and formed with a single or composite structure, and various materials including copper phthalocyanine (CuPc:), N,N'-Di(naphthalene-1-yl)-N,N'-diphenyl-benzidine (NPB), tris-8-hydroxyquinoline aluminum (Alq3) or the like may be applicable thereto. The low molecular organic layers may be formed using a vacuum deposition method.

In case of a high molecular organic layer, it may typically have a structure provided with the hole transport layer (HTL) and emission layer (EML), wherein PEDOT is used for the hole transport layer, and a poly-poly-phenylenevinylene (PPV)-based or polyfluorene-based high molecular organic material is used for the light-emitting layer, and it may be formed with screen printing, ink-jet printing or the like.

Such an organic layer may not be necessarily limited to this, and various embodiments may be, of course, applicable thereto.

On the other hand, the second electrode 131 may be provided with a transparent electrode or reflective electrode, and the second electrode 131 may be used as a cathode electrode when used as a transparent electrode, and thus a metal with a small work function, such as Li, Ca, LiF/Ca, LiF/Al, Al, Ag, Mg, and compounds thereof, may be deposited in the direction of the organic layer 129, and then an auxiliary electrode layer or bus electrode line may be formed thereon with a transparent electrode forming materials such as ITO, IZO, ZnO, $In_2O_3$ or the like. Furthermore, Li, Ca, LiF/Ca, LiF/Al, Al, Ag, Mg, and compounds thereof may be deposited and formed on an entire surface thereof when used as a reflective electrode.

An organic light emitting device (E) emits red, green and blue light according to the flow of a current to display a predetermined image information, which is provided with a first electrode 119a connected to the drain electrode 111b of the thin film transistor to supply plus power therefrom, a second electrode 131 provided to cover the entire pixel to supply minus power therefrom, and an organic layer 129 disposed between the first electrode 119a and second electrode 131 to emit light.

The first electrode 119a and second electrode 131 are insulated from each other through the organic layer 129, and voltages having different polarities are applied to the organic layer 129, thereby emitting light.

As described above, according to an organic light emitting device in accordance with the present invention, a hydrophilic first pixel define layer and a hydrophobic second pixel define layer may be applied using a layered structure, and a phenomenon in which an edge region on an organic layer within a pixel is drawn up a sidewall of the upper pixel define layer may be alleviated by the pixel define layer at a lower portion thereof during the drying process of an organic layer formed through a soluble process to maintain a thickness (t2) uniformity of the organic layer within the pixel region (P), thereby enhancing the light-emitting uniformity of the pixel.

On the other hand, a method for fabricating an organic light emitting device according to a first embodiment of the present disclosure will be described below with reference to FIGS. 5A through 5O.

Figure 5A:
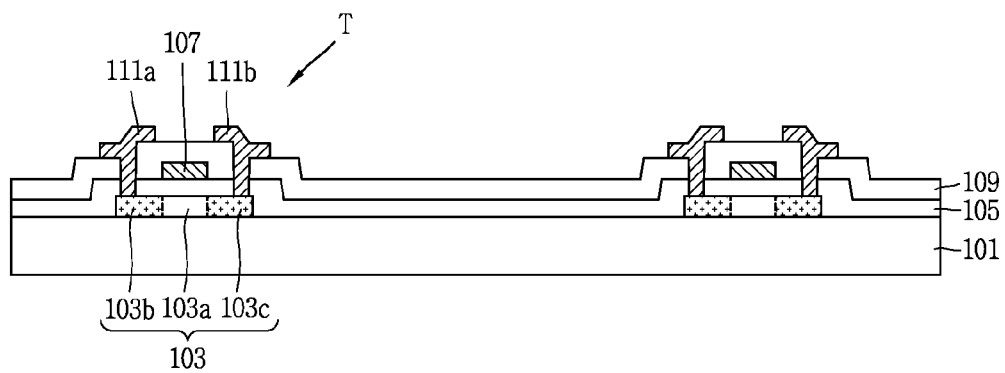
FIGS. 5A through 5O are fabrication process cross-sectional views illustrating a method for fabricating an organic electroluminescent device according to a first embodiment of the present invention.
Figure 5B:
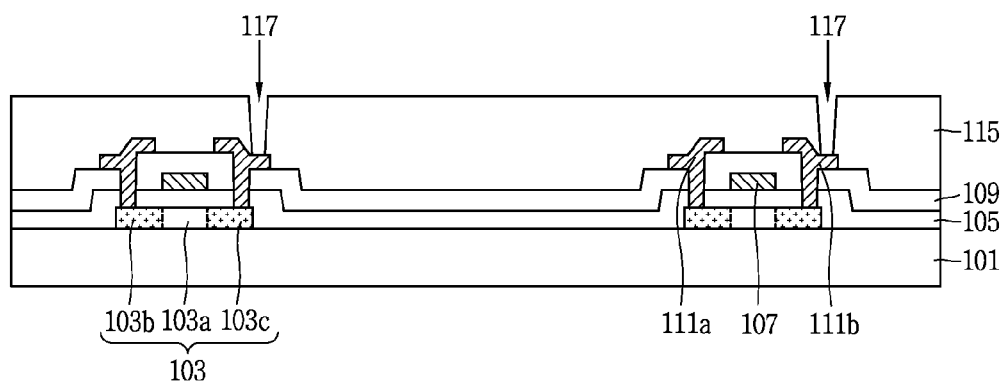
Figure 5C:
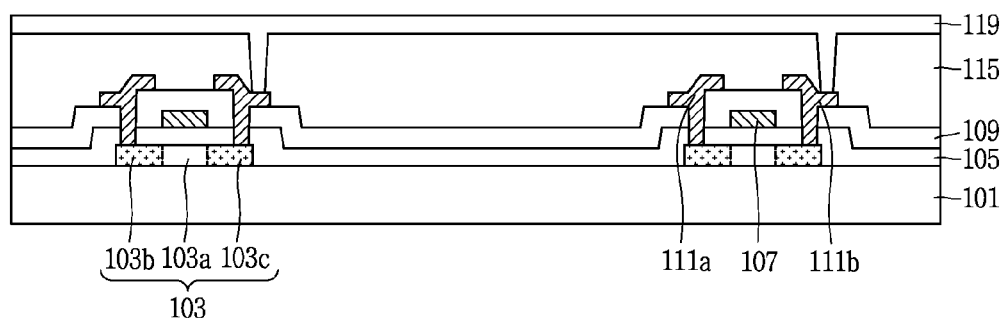
Figure 5D:
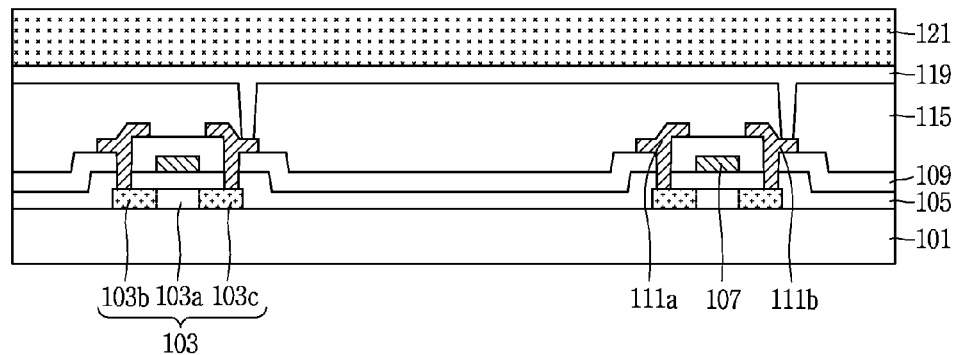
Figure 5E:
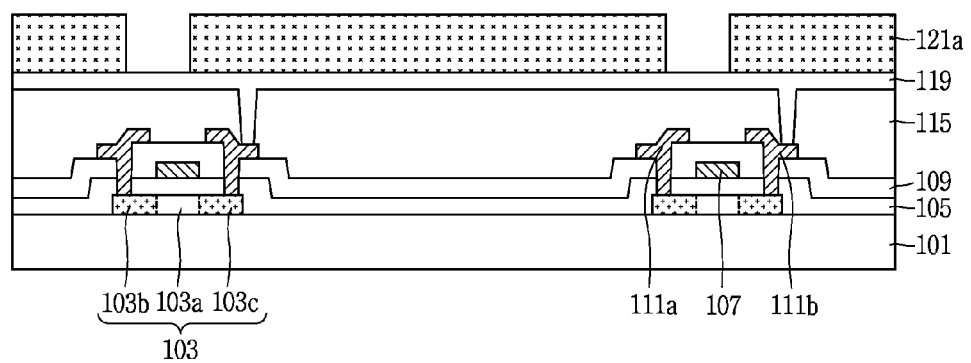
Figure 5F:
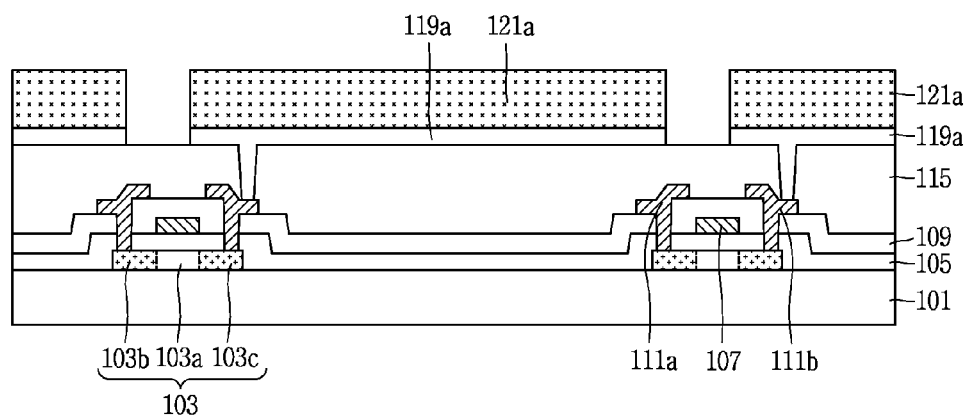
Figure 5G:
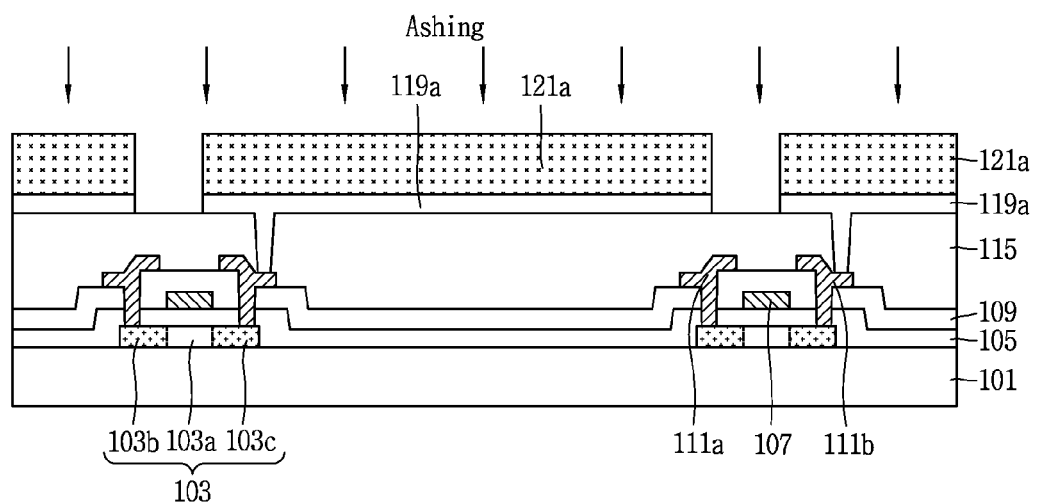
Figure 5H:
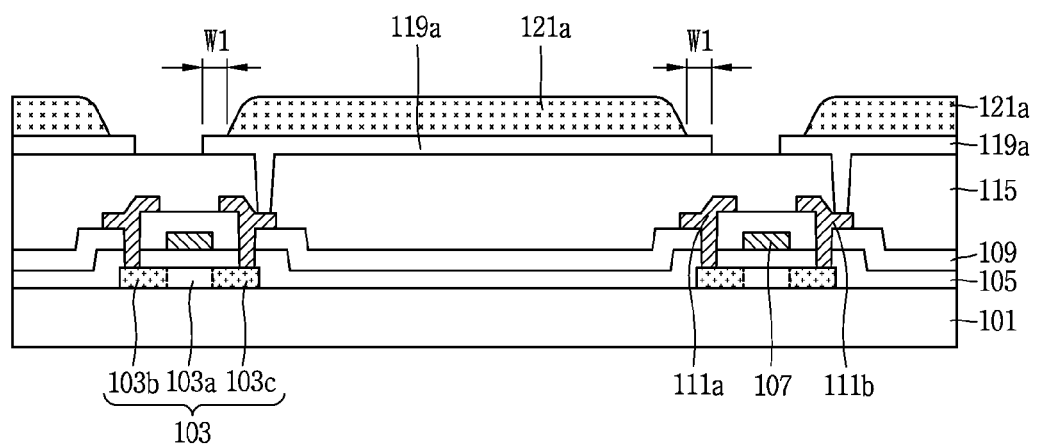
Figure 5I:
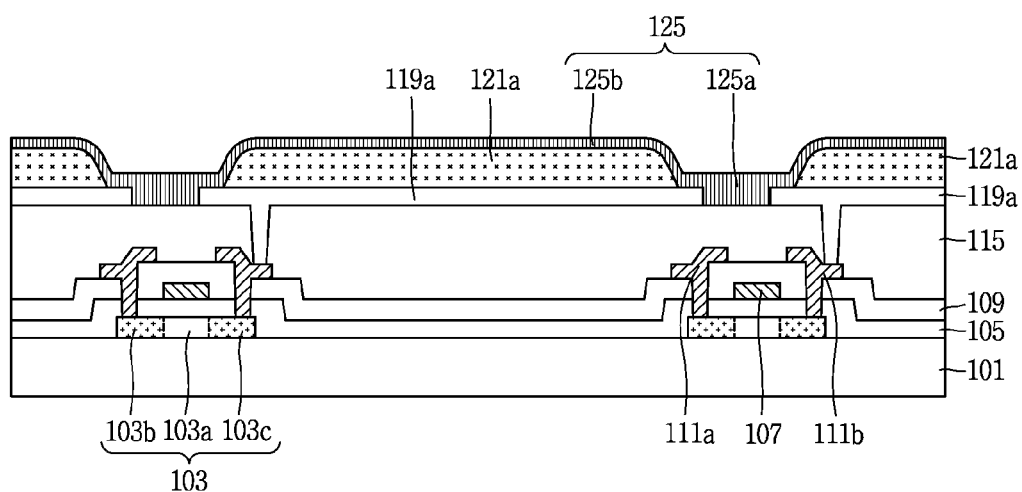
Figure 5J:
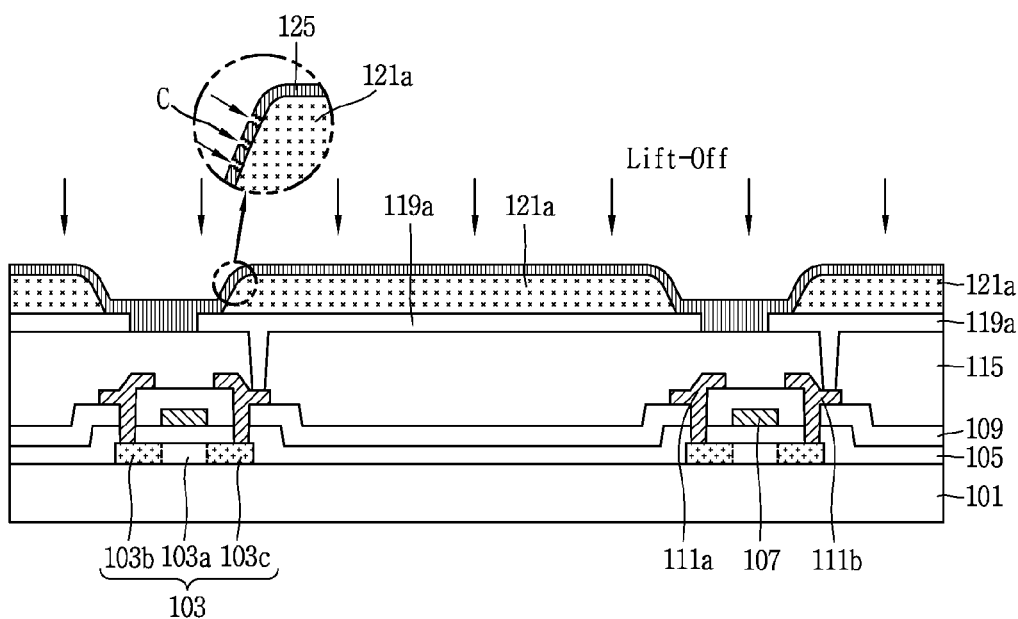
Figure 5K:
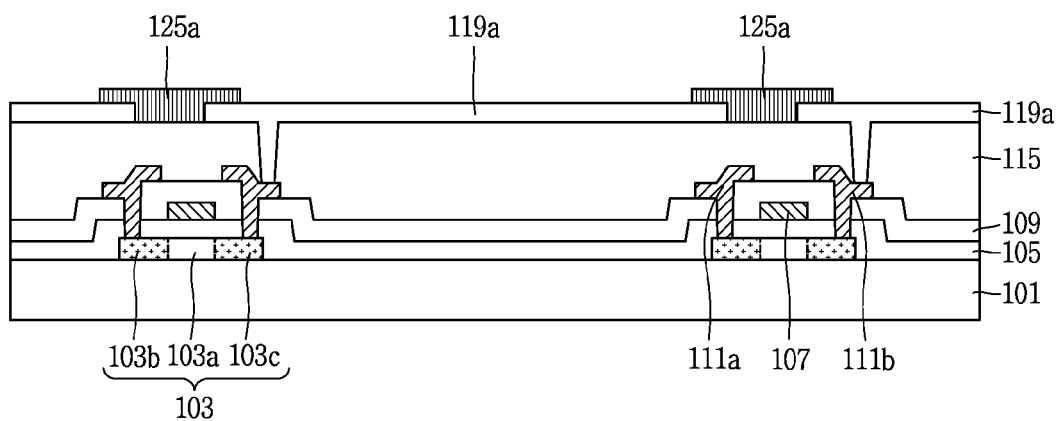
Figure 5L:
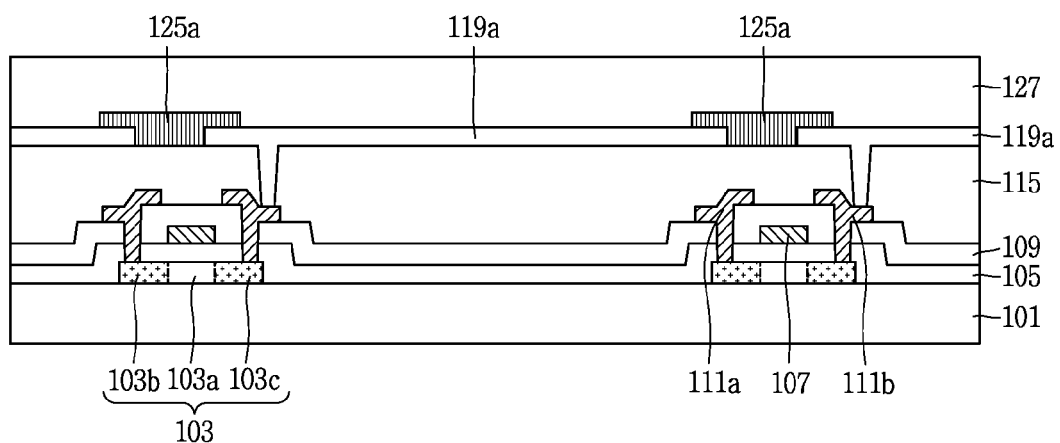
Figure 5M:
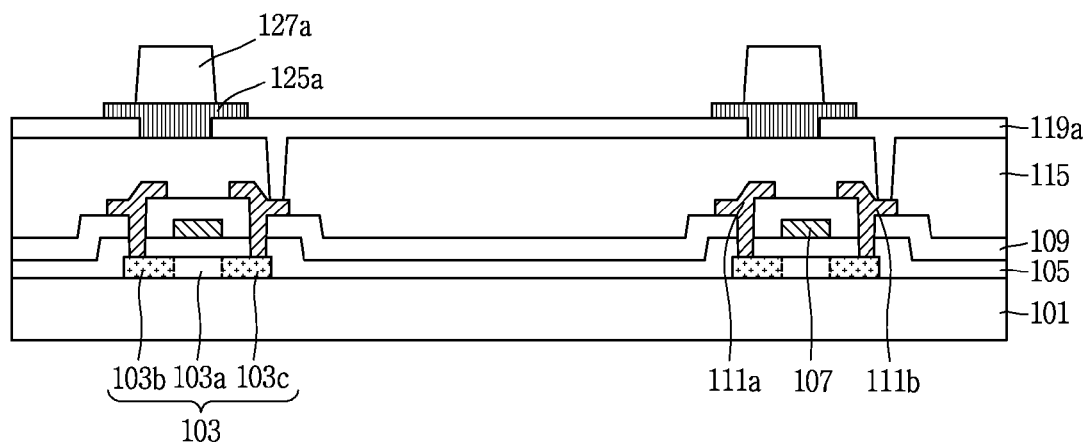
Figure 5N:
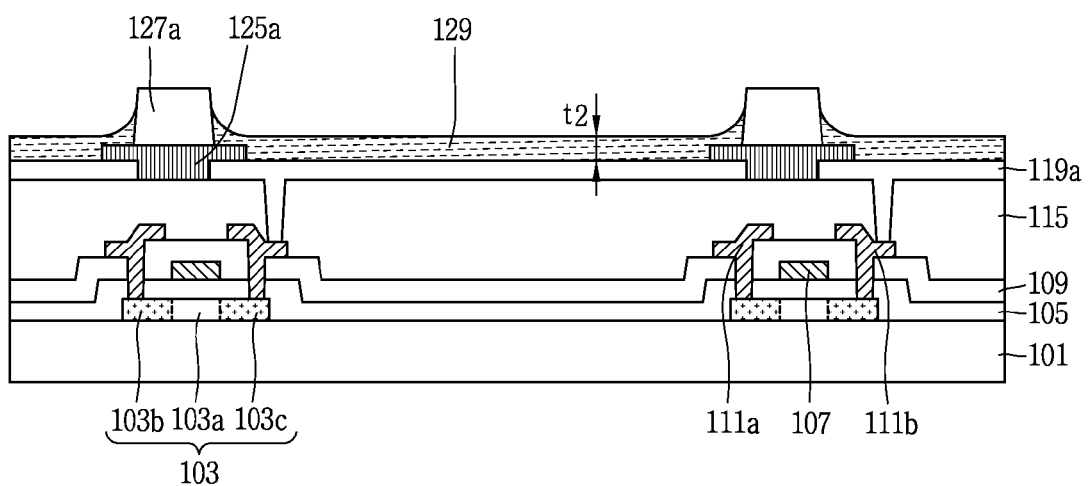
Figure 5O:
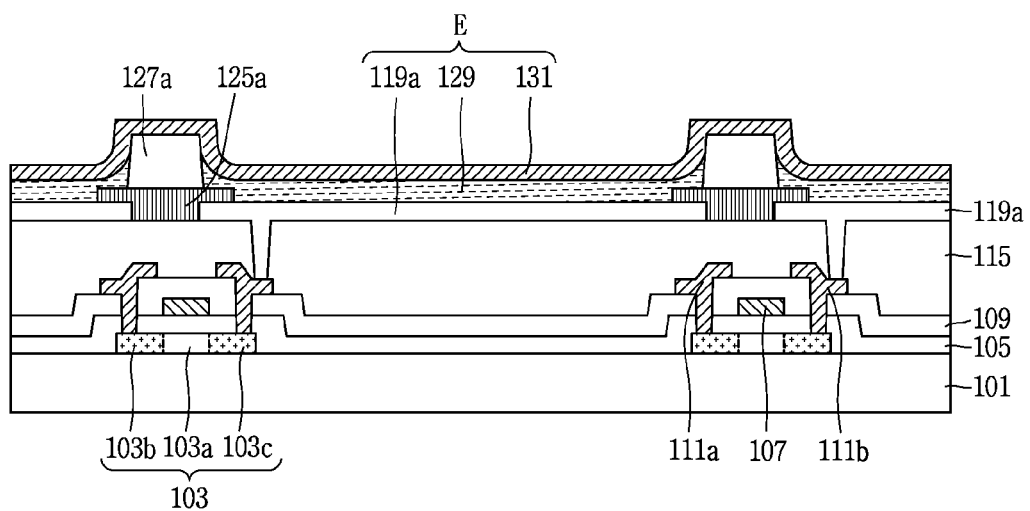

FIGS. 5A through 5O are fabrication process cross-sectional views illustrating a method for fabricating an organic electroluminescent device according to a first embodiment of the present invention.

Referring to FIG. 5A, first, a buffer layer (not shown) is formed on the substrate 101, and subsequently, an active layer 103 formed with a semiconductor material is provided on the buffer layer (not shown). Here, the active layer 103 formed on the substrate 101 may be selected and formed from an inorganic or organic semiconductor, and n-type or p-type impurities are doped in the source region 103b and drain region 103c, and a channel region 103a for connecting between the source region 103b and drain region 103c is provided therein.

An inorganic semiconductor forming the active layer 103 may include CdS, GaS, ZnS, CdSe, ZnSe, CdTe, SiC, and Si. Furthermore, an organic semiconductor forming the active layer 103 may include polythiophene and derivatives thereof, polyparaphenylene vinylene and derivatives thereof, polyparaphenylene and derivatives thereof, polyfluorene and derivatives thereof, polythiophene vinylene and derivatives thereof, polythiophene-heterocyclic aromatic copolymers and derivatives thereof as a high molecular substance, and may include oligoacene of pentacene, tetracene, naphthalene and derivatives thereof, oligothiophene of alpha-6-thiophene, alpha-5-thiophene and derivatives thereof, phthalocyanine containing or not containing a metal and derivatives thereof, pyromellitic dianhydride tick or pyromellitic diimide and derivatives thereof, perylene tetracarboxylic acid dianhydride or perylene tetracarboxylic diimide and derivatives thereof as a small molecular substance.

Next, a gate insulating layer 105 is formed to cover the active layer 103 on an entire surface of the substrate containing the active layer 103.

Subsequently, a gate electrode 107 is formed at an upper portion of the gate insulating layer 105. Here, the gate electrode 107 is connected to a gate line (not shown) applying an on/off signal of the thin film transistor (T). Here, the gate electrode 107 may be formed of a conductive metal layer such as MoW, Al, Cr, Al/Cu or the like, but may not be necessarily limited to them, and various conductive materials such as a conductive polymer or the like may be used for the gate electrode 107. The gate electrode 107 is formed to cover a region corresponding to the channel region 103a of the active layer 103.

Next, an interlayer insulating layer 109 is formed to cover the gate electrode 107 on an entire surface of the substrate containing the gate electrode 107.

Subsequently, a contact hole (not shown) for exposing the source region 103b and drain region 103c of the active layer 103 is formed on the interlayer insulating layer 109 and the gate insulating layer 105 at a lower portion thereof.

Next, the source electrode 111a and drain electrode 111b brought into contact with the source region 103b and drain region 103c, respectively, of the active layer 103 are formed through a contact hole (not shown) formed on the gate insulating layer 105 and interlayer insulating layer 109 on the interlayer insulating layer 109. Here, the source electrode 111a and drain electrode 111b may be formed of a conductive metal layer such as MoW, Al, Cr, Al/Cu or the like similarly to the gate electrode 107, but may not be necessarily limited to them, and various conductive materials such as a conductive polymer or the like may be used for the source electrode 111a and drain electrode 111b. The source electrode 111a and drain electrode 111b are formed to be separated from each other by the channel region 103a of the active layer 103.

Subsequently, referring to FIG. 5B, a passivation layer 115 made of $SiO_2$, SiNx or the like is formed at an upper portion of the source electrode 111a and drain electrode 111b. Here, the passivation layer 115 may perform the role of a protective layer for protecting the thin film transistor (T), and perform the role of a planarization layer for planarizing the upper surface thereof.

Next, a drain contact hole 117 for exposing the drain electrode 111b on the passivation layer 115 is formed through a mask process.

Subsequently, referring to FIGS. 5C and 5D, a first electrode forming conductive material layer 119 becoming an anode electrode of the organic light emitting device (E) is formed at an upper portion of the passivation layer 115. Here, the conductive material layer 119 may be provided with a transparent electrode and a reflective electrode, and thus may be provided with ITO, IZO, ZnO, or $In_2O_3$ when used as a transparent electrode, and a reflective layer may be formed of Ag, Mg, Al, Pt, Pd, Au, Ni, Nd, Ir, Cr, and compounds thereof and then ITO, IZO, ZnO, or $In_2O_3$ may be formed thereon when used as a reflective electrode.

Next, referring to FIG. 5E, a photosensitive layer 121 is coated on the conductive material layer 119, and then the photosensitive layer 121 is patterned through an exposure and development process using a mask to form a photoresist pattern 121a.

Subsequently, referring to FIG. 5F, the conductive material layer 119 is selectively etched using the photoresist pattern 121a as an etch mask to form the first electrode 119a electrically connected to the drain electrode 111b. Here, the first electrode 119a performs the function of an anode electrode, and a second electrode 131 which will be described later performs the function of a cathode electrode, but the first electrode 119a and second electrode 131 may be allowed to have opposite polarities to each other.

Next, referring to FIGS. 5G and 5H, the remaining photoresist pattern 121a is selectively etched until an upper edge portion of the first electrode 119a is exposed through an ashing process to expose the upper edge portion of the first electrode 119a by a predetermined width (W1).

Subsequently, referring to FIG. 5I, an inorganic material layer 125 is formed at high temperatures between about 220 and 300 degrees, for example, on an entire surface of the substrate containing the photoresist pattern 121a. Here, the inorganic material layer 125 may be formed of an inorganic material selected from $SiO_2$, $SiNx$, $Al_2O_3$, $CuOx$, $Tb_4O_7$, $Y_2O_3$, $Nb_2O_5$, $Pr_2O_3$ and the like having an insulating characteristic. Furthermore, the inorganic material layer 125 may be formed using a sputter method, a chemical vapor deposition (CVD) method, a deposition method or the like. The inorganic material layer 125 may include a remaining pattern portion (i.e., a first pixel define layer in the following process) 125a located between the adjoining first electrodes 119a containing an upper edge portion of the first electrode 119a and a sacrificial pattern portion 125b formed on a surface of the photoresist pattern 121a.

Then, since the inorganic material layer 125 is formed at high temperatures between about 220 and 300 degrees, as illustrated in FIG. 5J, the volume of the photoresist pattern 121a is increased and as a result, a crack (C) is generated on a surface of the sacrificial pattern portion 125b of the inorganic material layer 125 formed on a surface of the photoresist pattern 121a, and the surface of the photoresist pattern 121a is exposed to the outside due to the crack (C), thereby facilitating the infiltration of a stripper for photoresist removal during the following process.

Next, referring to FIGS. 5J and 5K, the photoresist pattern 121a is removed while at the same time removing the sacrificial pattern portion 125b of the inorganic material layer 125 formed on a surface of the photoresist pattern 121a, and as a result, the first pixel define layer 125a is formed between the adjoining first electrodes 119a containing an upper edge portion of the first electrode 119a. Here, the first pixel define layer 125a is made of a hydrophilic inorganic material.

Subsequently, referring to FIG. 5L, an organic material layer 127 is formed on an entire surface of the substrate containing the first pixel define layer 125a. Here, the organic material layer 127 as a hydrophobic organic substance having an insulating characteristic may be formed of one selected from a group consisted of polyacryl, polyimide, polyamide (PA), benzocyclobutene (BCB), and phenolic resin. The organic material layer 127 may be formed using a coating method such as spin coating, slot coating or the like.

Next, referring to FIG. 5M, the organic material layer 127 is selectively patterned through an exposure and development process using a mask to form the second pixel define layer 127a made of a hydrophobic organic material on the first pixel define layer 125a. Here, the second pixel define layer 127a has a smaller width than that of the first pixel define layer 125a, but is not formed on an upper surface excluding an upper edge portion of the first pixel define layer 125a. The first and the second pixel define layer 125a, 127a denote patterned insulating layers performing the role of more accurately defining a light-emitting region in fabricating an organic light emitting device. Furthermore, the second pixel define layer 127a may be formed using a method such as ink-jet or the like.

Subsequently, referring to FIG. 5N, a soluble material or polymer-based liquid substance is injected between banks formed by the first and the second pixel define layer 125a, 127a, namely, on the first electrode 119a, and dried to form the organic layer 129. Here, the organic layer 129 may be formed using a printing technology such as ink-jet, nozzle printing or the like to reduce the mask process and enhance the pattern accuracy.

Here, the organic layer 129 may include a light-emitting layer (not shown). Here, the present invention may not be necessarily limited to such a structure, and various structures of the organic light emitting device may be applicable thereto as they are.

A low or high molecular organic layer may be used for the organic layer 129, and when a low molecular organic layer is used, a hole injection layer (HIL), a hole transport layer (HTL), an emission layer (EML), an electron transport layer (ETL), and an electron injection layer (EIL) and the like may be deposited and formed with a single or composite structure, and various materials including copper phthalocyanine (CuPc:), N,N'-Di(naphthalene-1-yl)-N,N'-diphenyl-benzidine (NPB), tris-8-hydroxyquinoline aluminum (Alq3) or the like may be applicable thereto. The low molecular organic layers may be formed using a vacuum deposition method.

In case of a high molecular organic layer, it may typically have a structure provided with the hole transport layer (HTL) and emission layer (EML), wherein PEDOT is used for the hole transport layer, and a poly-poly-phenylenevinyline (PPV)-based or polyfluorene-based high molecular organic material is used for the light-emitting layer, and it may be formed with screen printing, ink-jet printing or the like.

Such an organic layer may not be necessarily limited to this, and various embodiments may be, of course, applicable thereto.

On the other hand, an electron transport layer (ETL), which is a conductive material for connecting a current flow between the light-emitting material and the first electrode 119a, is used for a material initially printed on the first electrode 119a, and typically used a material such as PEDOT or the like. The substance is a material having properties such as water, and the printing aspect may vary according to the material properties of the pixel define layer. For example, the organic material is widely spread out to be well stuck thereto when the pixel define layer is a hydrophilic substance, whereas the organic material is cohered in a round shape not to be stuck thereto when the pixel define layer is a hydrophobic substance.

According to the present invention, a bank is configured with a first electrode 119a made of a transparent conductive material such as hydrophilic ITO or the like, a first pixel define layer 125a made of a hydrophilic inorganic material, and a second pixel define layer 127a made of a hydrophobic organic material. In other words, the first pixel define layer 125a and first electrode 119a are hydrophilic such that an organic material is well stuck thereto, and the second pixel define layer 127a is hydrophobic such that an organic material is well gathered only within a pixel, and thus the organic material is well placed on the first electrode 119a subsequent to the drying process.

Accordingly, an item occupying the largest proportion of organic layer patterning process failures using a printing technology is an edge failure, and a thickness variation is generated within the organic layer while an edge region of the organic layer within the pixel is drawn up during the drying process of the organic layer while forming a pixel define layer having an existing single structure, thereby causing a failure in the edge region of the pixel.

However, according to the present invention, the first pixel define layer 125a made of an inorganic layer and the second pixel define layer 127a made of an organic layer are formed thereon to prevent a failure in the existing edge region of the pixel, and the first pixel define layer 125a is formed between the first electrodes 119a, and the second pixel define layer 127a is formed on an upper surface excluding an upper edge portion of the first pixel define layer 125a.

Accordingly, when the organic layer 129 is formed on the first electrode 119a, the first pixel define layer 125a and first electrode 119a are hydrophilic and thus organic materials are well stuck thereto, but the second organic pixel define layer 127a is hydrophobic and thus organic materials are well gathered only within the pixel, and accordingly, the organic materials are well placed on the first electrode 119a subsequent to the drying process, and as a result, a phenomenon in which an edge region on an organic layer within a pixel is drawn up a sidewall of the second pixel define layer 127a may be alleviated by the first pixel define layer 125a at a lower portion thereof during the drying process of the organic layer to maintain a thickness (t2) uniformity of the organic layer within the pixel region (P), thereby enhancing the light-emitting uniformity of the pixel.

Next, referring to FIG. 5O, the second electrode 131 is formed on an entire surface of the substrate containing the organic layer 129. Here, the second electrode 131 may be provided with a transparent electrode or reflective electrode, and the second electrode 131 may be used as a cathode electrode when used as a transparent electrode, and thus a metal with a small work function, such as Li, Ca, LiF/Ca, LiF/Al, Al, Ag, Mg, and compounds thereof, may be deposited in the direction of the organic layer 129, and then an auxiliary electrode layer or bus electrode line may be formed thereon with a transparent electrode forming materials such as ITO, IZO, ZnO, $In_2O_3$ or the like. Furthermore, Li, Ca, LiF/Ca, LiF/Al, Al, Ag, Mg, and compounds thereof may be deposited and formed on an entire surface thereof when used as a reflective electrode.

Accordingly, an organic light emitting device (E) emits red, green and blue light according to the flow of a current to display a predetermined image information, which is provided with a first electrode 119a connected to the drain electrode 111b of the thin film transistor to supply plus power therefrom, a second electrode 131 provided to cover the entire pixel to supply minus power therefrom, and an organic layer 129 disposed between the first electrode 119a and second electrode 131 to emit light.

The first electrode 119a and second electrode 131 are insulated from each other through the organic layer 129, and voltages having different polarities are applied to the organic layer 129, thereby emitting light.

As described above, the process of a method for fabricating an organic light emitting device according to a first embodiment of the present invention will be completed.

According to a method for fabricating an organic light emitting device in accordance with a first embodiment of the present invention, a first pixel define layer may be formed through a lift-off process and thus a dry etching or wet etching process may be omitted to minimize a damage on an ITO surface or lower layer of the first electrode, thereby enhancing the light-emitting uniformity and lifespan of the pixel.

Furthermore, according to a method for fabricating an organic light emitting device in accordance with a first embodiment of the present invention, a first pixel define layer may be formed through a lift-off process and thus a dry etching or wet etching process may be omitted to reduce the number of fabrication processes, thereby reducing the fabrication cost.

In addition, according to a method for fabricating an organic light emitting device in accordance with a first embodiment of the present invention, a phenomenon in which an edge region on an organic layer within a pixel is drawn up a sidewall of the upper pixel define layer may be alleviated by the pixel define layer at a lower portion thereof during the drying process of an organic layer formed through a soluble process to maintain a thickness (t2) uniformity of the organic layer within the pixel region (P), thereby enhancing the light-emitting uniformity of the pixel.

On another hand, a method for fabricating an organic light emitting device according to a second embodiment of the present disclosure will be described below with reference to FIGS. 6A through 6O.

Figure 6A:
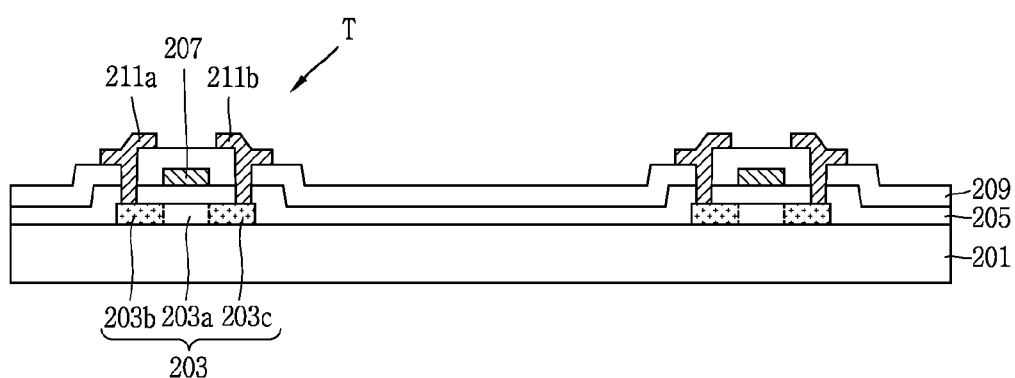
FIGS. 6A through 6O are fabrication process cross-sectional views illustrating a method for fabricating an organic electroluminescent device according to a second embodiment of the present invention.
Figure 6B:
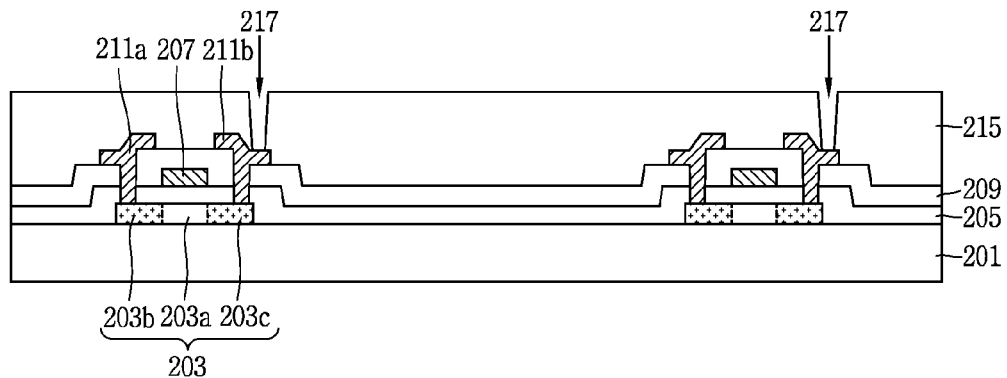
Figure 6C:
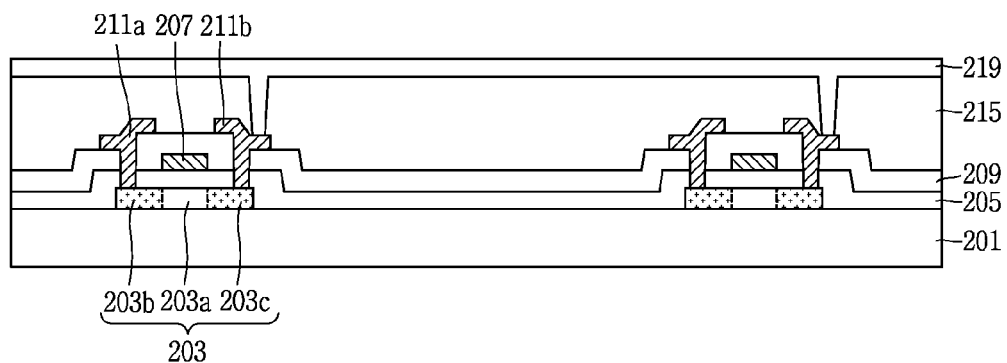
Figure 6D:
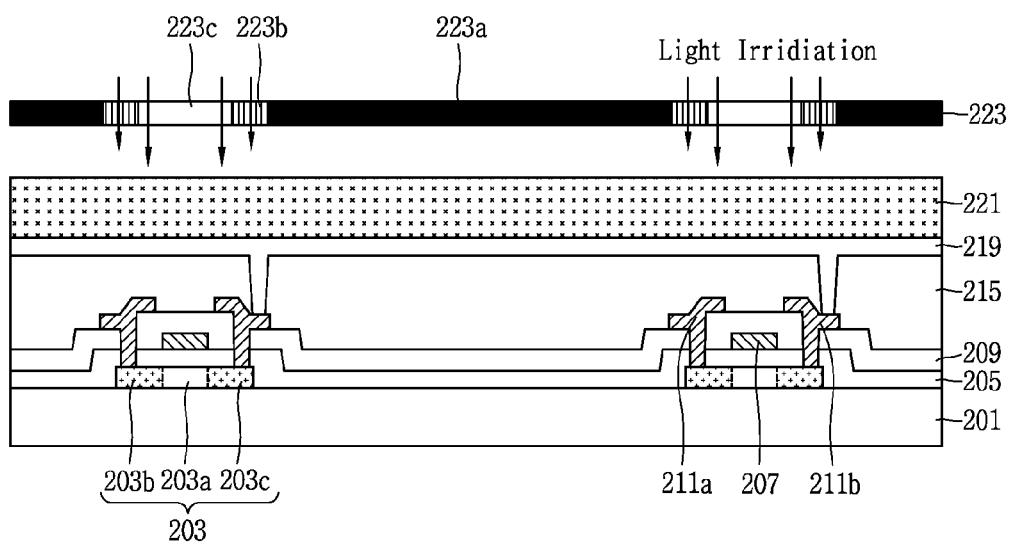
Figure 6E:
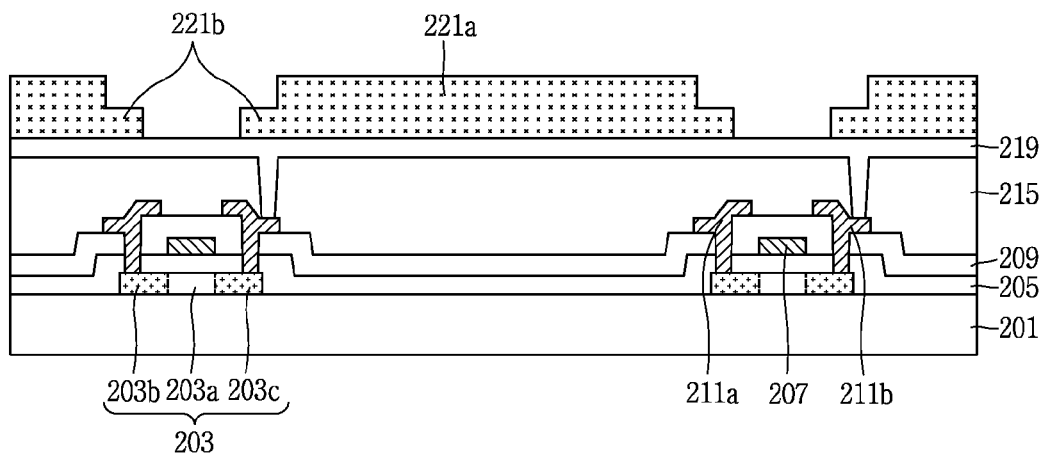
Figure 6F:
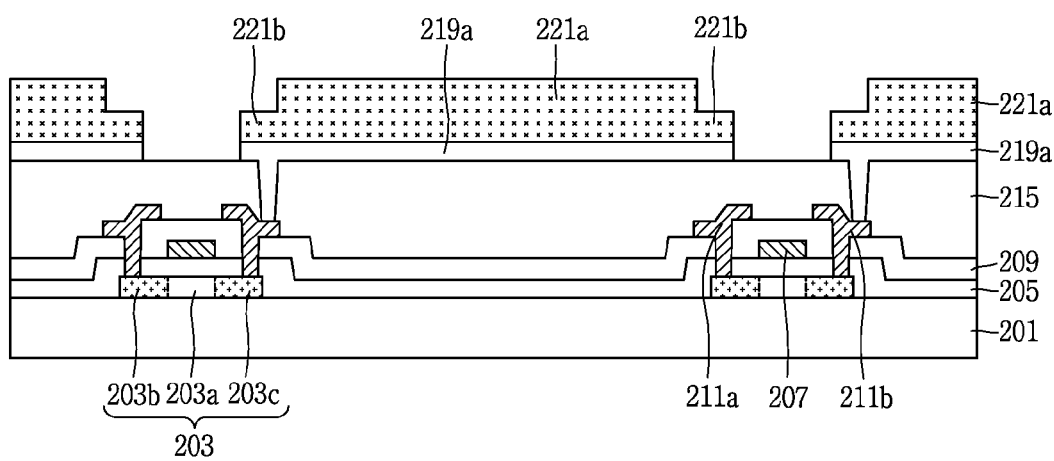
Figure 6G:
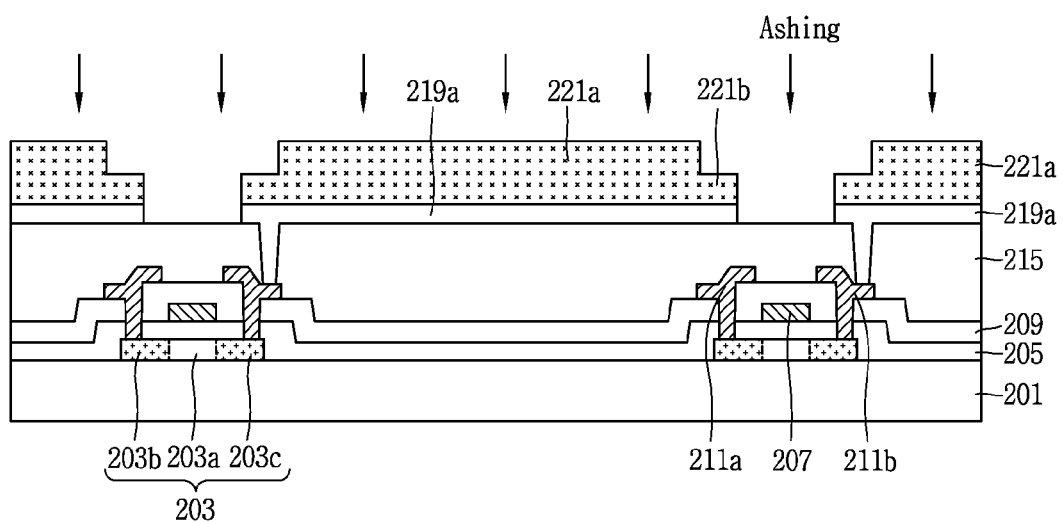
Figure 6H:
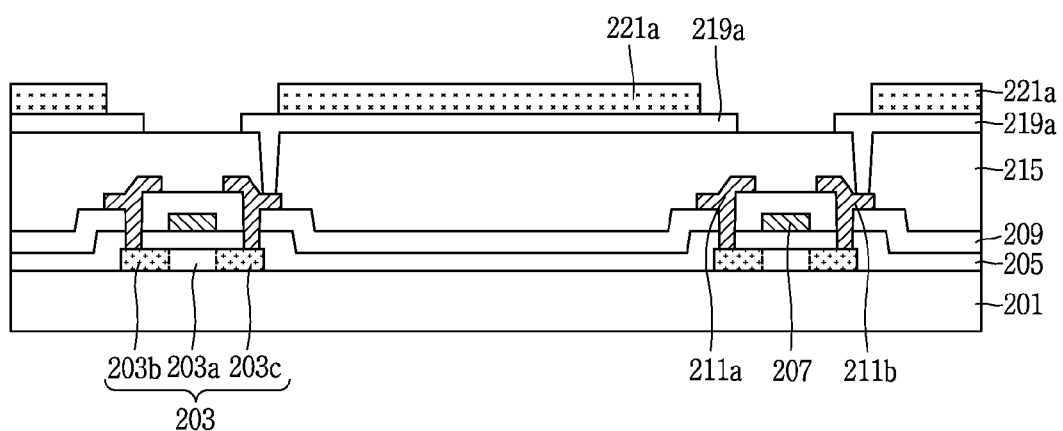
Figure 6I:
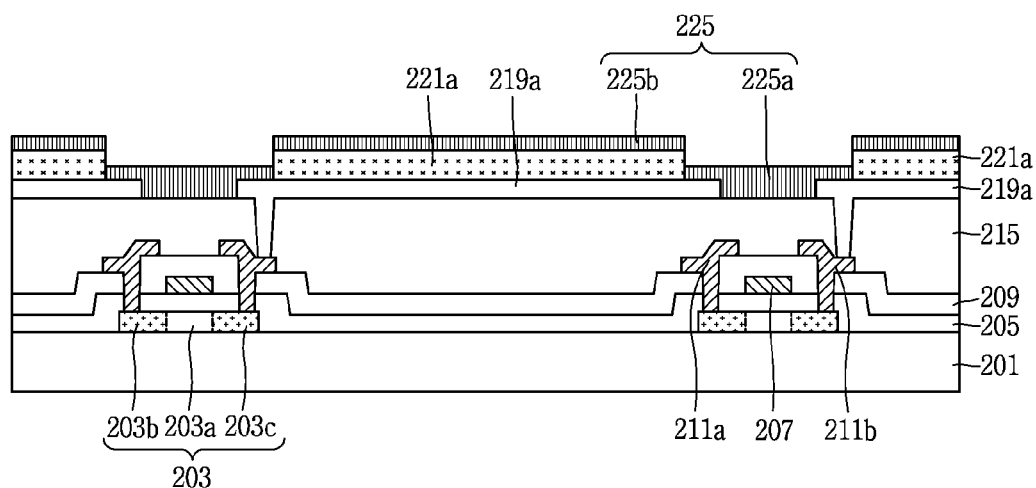
Figure 6J:
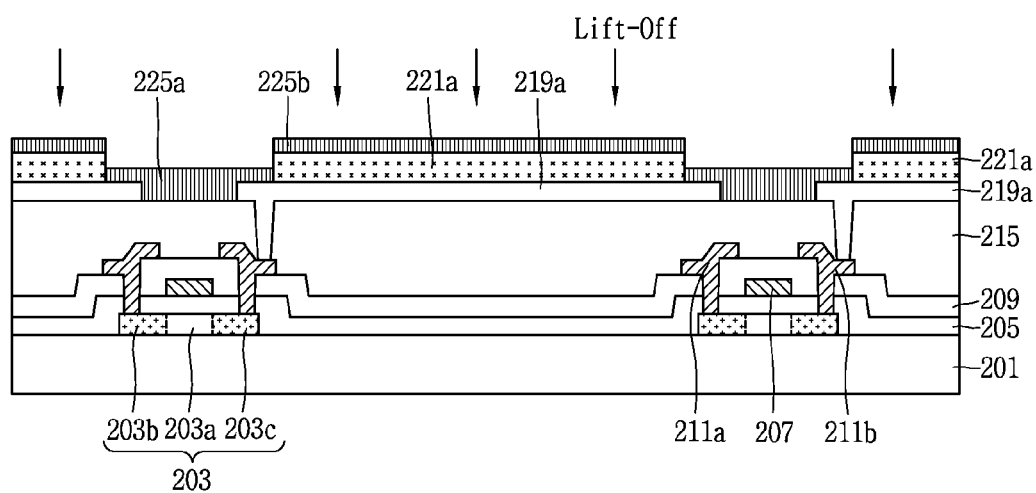
Figure 6K:
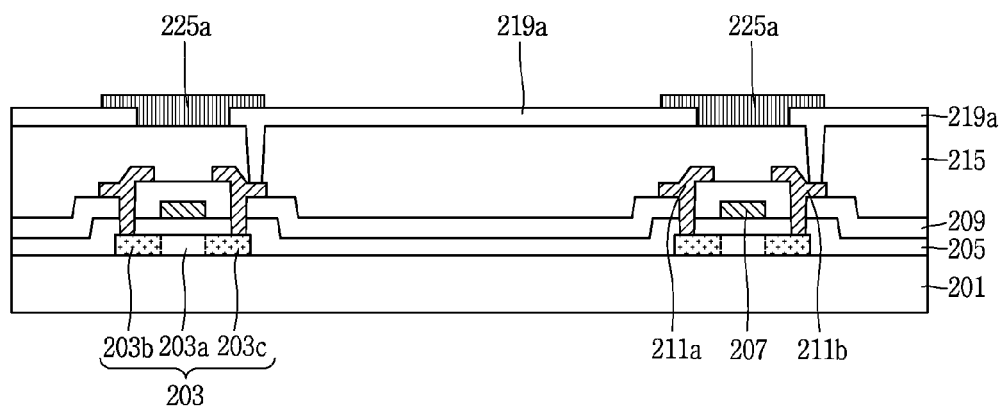
Figure 6L:
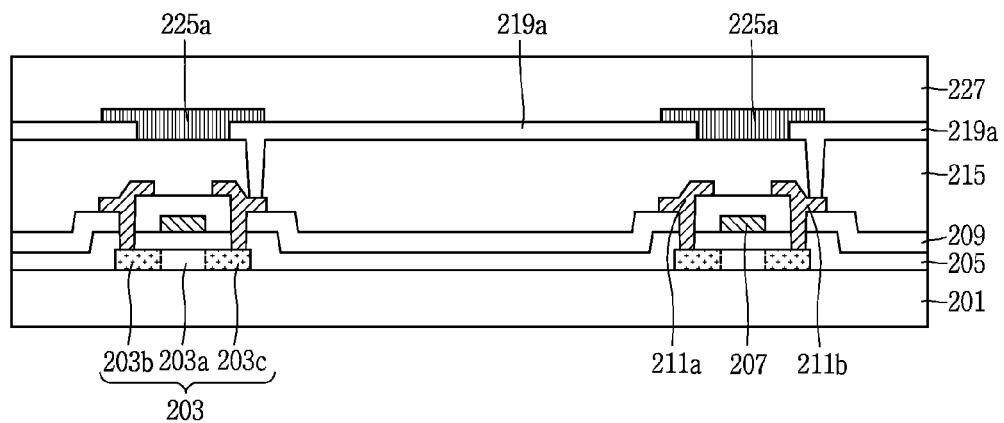
Figure 6M:
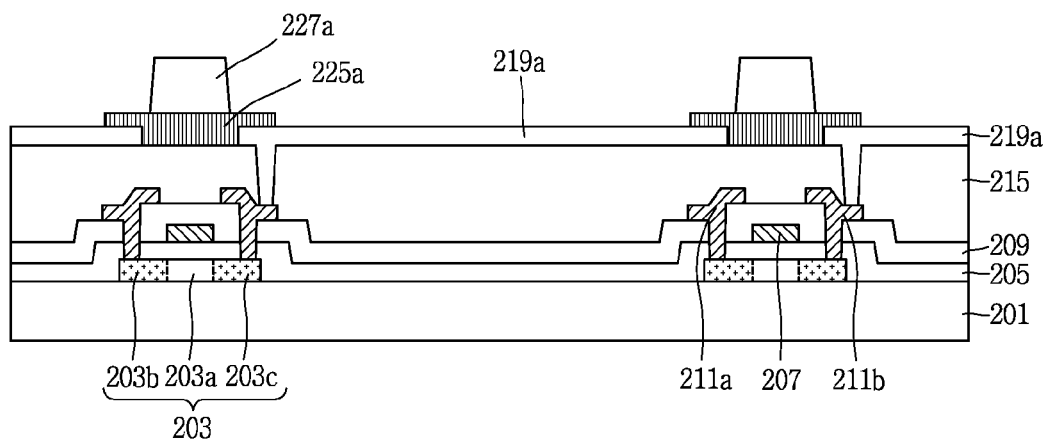
Figure 6N:
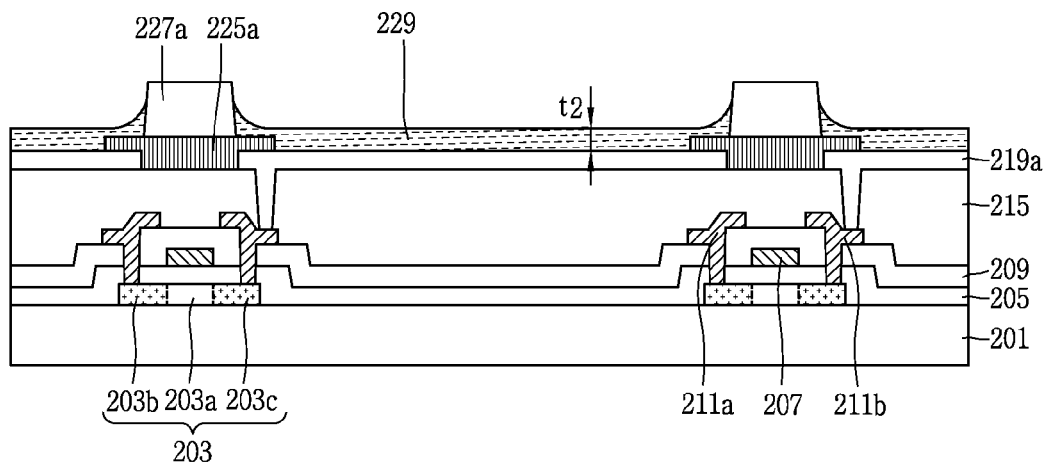
Figure 6O:
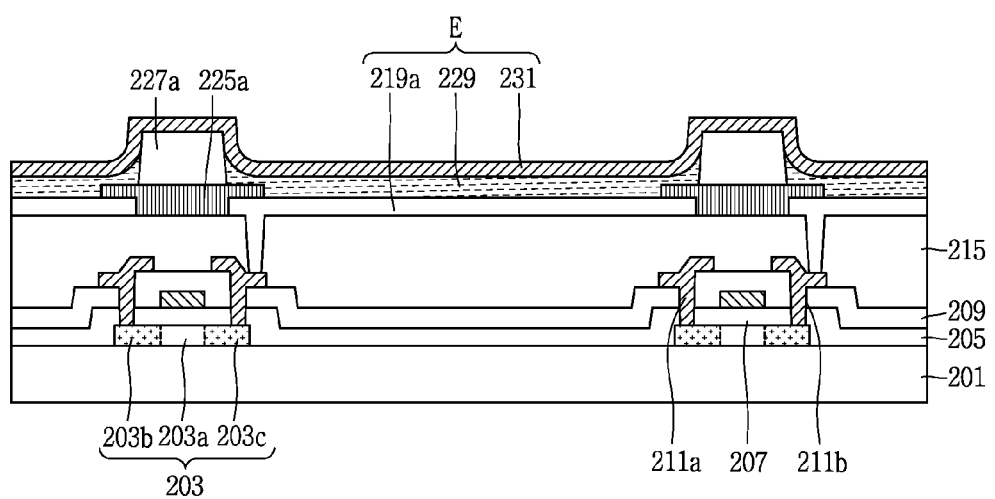

FIGS. 6A through 6O are fabrication process cross-sectional views illustrating a method for fabricating an organic electroluminescent device according to a second embodiment of the present invention.

Referring to FIG. 6A, first, a buffer layer (not shown) is formed on the substrate 201, and subsequently, an active layer 203 formed with a semiconductor material is provided on the buffer layer (not shown). Here, the active layer 203 formed on the substrate 201 may be selected and formed from an inorganic or organic semiconductor, and n-type or p-type impurities are doped in the source region 203b and drain region 203c, and a channel region 203a for connecting between the source region 203b and drain region 203c is provided therein.

An inorganic semiconductor forming the active layer 203 may include CdS, GaS, ZnS, CdSe, ZnSe, CdTe, SiC, and Si. Furthermore, an organic semiconductor forming the active layer 203 may include polythiophene and derivatives thereof, polyparaphenylene vinylene and derivatives thereof, polyparaphenylene and derivatives thereof, polyfluorene and derivatives thereof, polythiophene vinylene and derivatives thereof, polythiophene-heterocyclic aromatic copolymers and derivatives thereof as a high molecular substance, and may include oligoacene of pentacene, tetracene, naphthalene and derivatives thereof, oligothiophene of alpha-6-thiophene, alpha-5-thiophene and derivatives thereof, phthalocyanine containing or not containing a metal and derivatives thereof, pyromellitic dianhydride tick or pyromellitic diimide and derivatives thereof, perylene tetracarboxylic acid dianhydride or perylene tetracarboxylic diimide and derivatives thereof as a small molecular substance.

Next, a gate insulating layer 205 is formed to cover the active layer 203 on an entire surface of the substrate containing the active layer 203.

Subsequently, a gate electrode 207 is formed at an upper portion of the gate insulating layer 205. Here, the gate electrode 207 is connected to a gate line (not shown) applying an on/off signal of the thin film transistor (T). Here, the gate electrode 207 may be formed of a conductive metal layer such as MoW, Al, Cr, Al/Cu or the like, but may not be necessarily limited to them, and various conductive materials such as a conductive polymer or the like may be used for the gate electrode 207. The gate electrode 207 is formed to cover a region corresponding to the channel region 203a of the active layer 203.

Next, an interlayer insulating layer 209 is formed to cover the gate electrode 207 on an entire surface of the substrate containing the gate electrode 207.

Subsequently, a contact hole (not shown) for exposing the source region 203b and drain region 203c of the active layer 203 is formed on the interlayer insulating layer 209 and the gate insulating layer 205 at a lower portion thereof.

Next, the source electrode 211a and drain electrode 211b brought into contact with the source region 203b and drain region 203c, respectively, of the active layer 203 are formed through a contact hole (not shown) formed on the gate insulating layer 205 and interlayer insulating layer 209 on the interlayer insulating layer 209. Here, the source electrode 211a and drain electrode 211b may be formed of a conductive metal layer such as MoW, Al, Cr, Al/Cu or the like similarly to the gate electrode 207, but may not be necessarily limited to them, and various conductive materials such as a conductive polymer or the like may be used for the source electrode 211a and drain electrode 211b. The source electrode 211a and drain electrode 211b are formed to be separated from each other by the channel region 203a of the active layer 203.

Subsequently, referring to FIG. 6B, a passivation layer 215 made of $SiO_2$, SiNx or the like is formed at an upper portion of the source electrode 211a and drain electrode 211b. Here, the passivation layer 215 may perform the role of a protective layer for protecting the thin film transistor (T), and perform the role of a planarization layer for planarizing the upper surface thereof.

Next, a drain contact hole 217 for exposing the drain electrode 211b on the passivation layer 215 is formed through a mask process.

Subsequently, referring to FIGS. 6C and 6D, a first electrode forming conductive material layer 219 becoming an anode electrode of the organic light emitting device (E) is formed at an upper portion of the passivation layer 215. Here, the conductive material layer 219 may be provided with a transparent electrode and a reflective electrode, and thus may be provided with ITO, IZO, ZnO, or $In_2O_3$ when used as a transparent electrode, and a reflective layer may be formed of Ag, Mg, Al, Pt, Pd, Au, Ni, Nd, Ir, Cr, and compounds thereof and then ITO, IZO, ZnO, or $In_2O_3$ may be formed thereon when used as a reflective electrode.

Next, a photosensitive layer 221 is coated on the conductive material layer 219, and then an exposure process using a diffraction mask 223 with a diffraction phenomenon is carried out. Here, the diffraction mask 223 may include a light blocking portion 223a for blocking light, a semi-transmissive portion 223b for transmitting part of light, and a transmissive portion 223c for transmitting the entire light. Furthermore, in addition to the diffraction mask 223, a half-tone mask or other masks using the diffraction or transmittance difference of light may be also used.

Subsequently, referring to FIG. 6E, subsequent to implementing the exposure process, a light irradiation portion of the photosensitive layer 221 is removed through a development process to form a first photoresist pattern 221a having a different first thickness and a second photoresist pattern 221b having a smaller thickness than the first thickness.

Subsequently, referring to FIG. 6F, the conductive material layer 219 is selectively etched using the first and the second photoresist pattern 221a, 221b as an etch mask to form the first electrode 219a electrically connected to the drain electrode 211b. Here, the first electrode 219a performs the function of an anode electrode, and a second electrode 231 which will be described later performs the function of a cathode electrode, but the first electrode 219a and second electrode 231 may be allowed to have opposite polarities to each other.

Next, referring to FIGS. 6G and 6H, the second photoresist pattern 221b selectively etched until an upper edge portion of the first electrode 219a of the remaining first and second photoresist patterns 221a, 221b is exposed through an ashing process to expose the upper edge portion of the first electrode 219a by a predetermined width (not shown).

Next, referring to FIG. 6I, an inorganic material layer 225 is formed at high temperatures between about 220 and 300 degrees, for example, on an entire surface of the substrate containing the photoresist pattern 221a. Here, the inorganic material layer 225 may be formed of an inorganic material selected from $SiO_2$, SiNx, $Al_2O_3$, CuOx, $Tb_4O_7$, $Y_2O_3$, $Nb_2O_5$, $Pr_2O_3$ and the like having an insulating characteristic. Furthermore, the inorganic material layer 225 may be formed using a sputter method, a chemical vapor deposition (CVD) method, a deposition method or the like. The inorganic material layer 225 may include a remaining pattern portion (i.e., a first pixel define layer in the following process) 225a located between the adjoining first electrodes 219a containing an upper edge portion of the first electrode 219a and a sacrificial pattern portion 225b formed on a surface of the photoresist pattern 221a.

Then, since the inorganic material layer 225 is formed at high temperatures between about 220 and 300 degrees, the volume of the first photoresist pattern 221a is increased and as a result, a crack (C) is generated on a surface of the sacrificial pattern portion 225b of the inorganic material layer 225 formed on a surface of the first photoresist pattern 221a, and the surface of the first photoresist pattern 221a is exposed to the outside due to the crack, thereby facilitating the infiltration of a stripper for photoresist removal during the following process.

Subsequently, referring to FIGS. 6J and 6K, the first photoresist pattern 221a is removed while at the same time removing the sacrificial pattern portion 225b of the inorganic material layer 225 formed on a surface of the first photoresist pattern 221a, and as a result, the first pixel define layer 225a is formed between the adjoining first electrodes 219a containing an upper edge portion of the first electrode 219a. Here, the first pixel define layer 225a is made of a hydrophilic inorganic material.

Next, referring to FIG. 6L, an organic material layer 227 is formed on an entire surface of the substrate containing the first pixel define layer 225a. Here, the organic material layer 227 as a hydrophobic organic substance having an insulating characteristic may be formed of one selected from a group consisted of polyacryl, polyimide, polyamide (PA), benzocyclobutene (BCB), and phenolic resin. The organic material layer 227 may be formed using a coating method such as spin coating, slot coating or the like.

Subsequently, referring to FIG. 6M, the organic material layer 227 is selectively patterned through an exposure and development process using a mask to form the second pixel define layer 227a made of a hydrophobic organic material on the first pixel define layer 225a. Here, the second pixel define layer 227a has a smaller width than that of the first pixel define layer 225a, but is not formed on an upper surface excluding an upper edge portion of the first pixel define layer 225a. The first and the second pixel define layer 225a, 227a denote patterned insulating layers performing the role of more accurately defining a light-emitting region in fabricating an organic light emitting device. Furthermore, the second pixel define layer 227a may be formed using a method such as ink-jet or the like.

Next, referring to FIG. 6N, a soluble material or polymer-based liquid substance is injected between banks formed by the first and the second pixel define layer 225a, 227a, namely, on the first electrode 219a, and dried to form the organic layer 229. Here, the organic layer 229 may be formed using a printing technology such as ink-jet, nozzle printing or the like to reduce the mask process and enhance the pattern accuracy.

Here, the organic layer 229 may include a light-emitting layer (not shown). Here, the present invention may not be necessarily limited to such a structure, and various structures of the organic light emitting device may be applicable thereto as they are.

A low or high molecular organic layer may be used for the organic layer 229, and when a low molecular organic layer is used, a hole injection layer (HIL), a hole transport layer (HTL), an emission layer (EML), an electron transport layer (ETL), and an electron injection layer (EIL) and the like may be deposited and formed with a single or composite structure, and various materials including copper phthalocyanine (CuPc:), N,N'-Di(naphthalene-1-yl)-N,N'-diphenyl-benzidine (NPB), tris-8-hydroxyquinoline aluminum (Alq3) or the like may be applicable thereto. The low molecular organic layers may be formed using a vacuum deposition method.

In case of a high molecular organic layer, it may typically have a structure provided with the hole transport layer (HTL) and emission layer (EML), wherein PEDOT is used for the hole transport layer, and a poly-poly-phenylenevinylene (PPV)-based or polyfluorene-based high molecular organic material is used for the light-emitting layer, and it may be formed with screen printing, ink-jet printing or the like.

Such an organic layer may not be necessarily limited to this, and various embodiments may be, of course, applicable thereto.

On the other hand, an electron transport layer (ETL), which is a conductive material for connecting a current flow between the light-emitting material and the first electrode 219a, is used for a material initially printed on the first electrode 219a, and typically used a material such as PEDOT or the like. The substance is a material having properties such as water, and the printing aspect may vary according to the material properties of the pixel define layer. For example, the organic material is widely spread out to be well stuck thereto when the pixel define layer is a hydrophilic substance, whereas the organic material is cohered in a round shape not to be stuck thereto when the pixel define layer is a hydrophobic substance.

According to the present invention, a bank is configured with a first electrode 219a made of a transparent conductive material such as hydrophilic ITO or the like, a first pixel define layer 225a made of a hydrophilic inorganic material, and a second pixel define layer 227a made of a hydrophobic organic material. In other words, the first pixel define layer 225a and first electrode 219a are hydrophilic such that an organic material is well stuck thereto, and the second pixel define layer 227a is hydrophobic such that an organic material is well gathered only within a pixel, and thus the organic material is well placed on the first electrode 219a subsequent to the drying process.

Accordingly, an item occupying the largest proportion of organic layer patterning process failures using a printing technology is an edge failure, and a thickness variation is generated within the organic layer while an edge region of the organic layer within the pixel is drawn up during the drying process of the organic layer while forming a pixel define layer having an existing single structure, thereby causing a failure in the edge region of the pixel.

However, according to the present invention, the first pixel define layer 225a made of an inorganic layer and the second pixel define layer 227a made of an organic layer are formed thereon to prevent a failure in the existing edge region of the pixel, and the first pixel define layer 225a is formed between the first electrodes 219a, and the second pixel define layer 227a is formed on an upper surface excluding an upper edge portion of the first pixel define layer 225a.

Accordingly, when the organic layer 229 is formed on the first electrode 219a, the first pixel define layer 225a and first electrode 219a are hydrophilic and thus organic materials are well stuck thereto, but the second organic pixel define layer 227a is hydrophobic and thus organic materials are well gathered only within the pixel, and accordingly, the organic materials are well placed on the first electrode 219a subsequent to the drying process, and as a result, a phenomenon in which an edge region on an organic layer within a pixel is drawn up a sidewall of the second pixel define layer 227a may be alleviated by the first pixel define layer 225a at a lower portion thereof during the drying process of the organic layer to maintain a thickness (t2) uniformity of the organic layer within the pixel region (P), thereby enhancing the light-emitting uniformity of the pixel.

Next, referring to FIG. 6O, the second electrode 231 is formed on an entire surface of the substrate containing the organic layer 229. Here, the second electrode 231 may be provided with a transparent electrode or reflective electrode, and the second electrode 231 may be used as a cathode electrode when used as a transparent electrode, and thus a metal with a small work function, such as Li, Ca, LiF/Ca, LiF/Al, Al, Ag, Mg, and compounds thereof, may be deposited in the direction of the organic layer 229, and then an auxiliary electrode layer or bus electrode line may be formed thereon with a transparent electrode forming materials such as ITO, IZO, ZnO, $In_2O_3$ or the like. Furthermore, Li, Ca, LiF/Ca, LiF/Al, Al, Ag, Mg, and compounds thereof may be deposited and formed on an entire surface thereof when used as a reflective electrode.

Accordingly, an organic light emitting device (E) emits red, green and blue light according to the flow of a current to display a predetermined image information, which is provided with a first electrode 219a connected to the drain electrode 211b of the thin film transistor to supply plus power therefrom, a second electrode 231 provided to cover the entire pixel to supply minus power therefrom, and an organic layer 229 disposed between the first electrode 219a and second electrode 231 to emit light.

The first electrode 219a and second electrode 231 are insulated from each other through the organic layer 229, and voltages having different polarities are applied to the organic layer 229, thereby emitting light.

As described above, the process of a method for fabricating an organic light emitting device according to a second embodiment of the present invention will be completed.

According to a method for fabricating an organic light emitting device in accordance with a second embodiment of the present invention, a first pixel define layer may be formed through a lift-off process and thus a dry etching or wet etching process may be omitted to minimize a damage on an ITO surface or lower layer of the first electrode similarly to the foregoing first embodiment, thereby enhancing the light-emitting uniformity and lifespan of the pixel.

Furthermore, according to a method for fabricating an organic light emitting device in accordance with a second embodiment of the present invention, a first pixel define layer may be formed through a lift-off process and thus a dry etching or wet etching process may be omitted to reduce the number of fabrication processes, thereby reducing the fabrication cost.

In addition, according to a method for fabricating an organic light emitting device in accordance with a second embodiment of the present invention, a phenomenon in which an edge region on an organic layer within a pixel is drawn up a sidewall of the upper pixel define layer may be alleviated by the pixel define layer at a lower portion thereof during the drying process of an organic layer formed through a soluble process to maintain a thickness (t2) uniformity of the organic layer within the pixel region (P), thereby enhancing the light-emitting uniformity of the pixel.

On still another hand, a method for fabricating an organic light emitting device according to a third embodiment of the present disclosure will be described below with reference to FIGS. 7A through 7O.

Figure 7A:
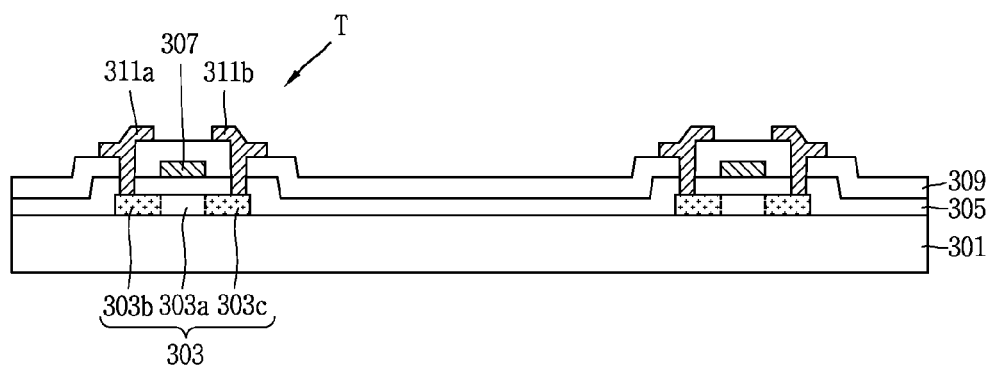
FIGS. 7A through 7O are fabrication process cross-sectional views illustrating a method for fabricating an organic electroluminescent device according to a third embodiment of the present invention.
Figure 7B:
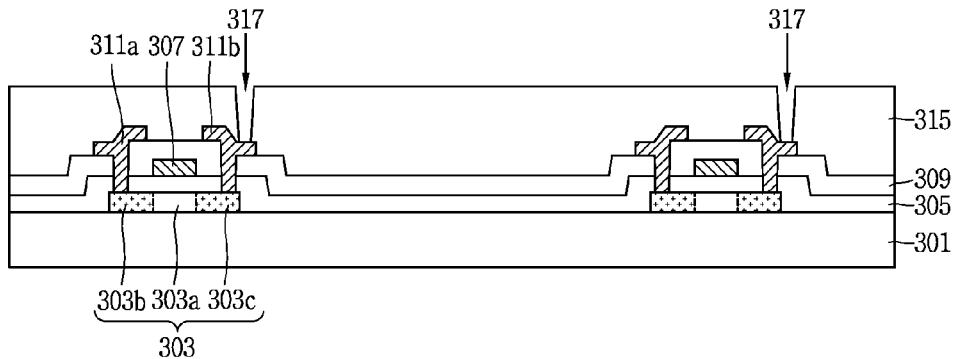
Figure 7C:
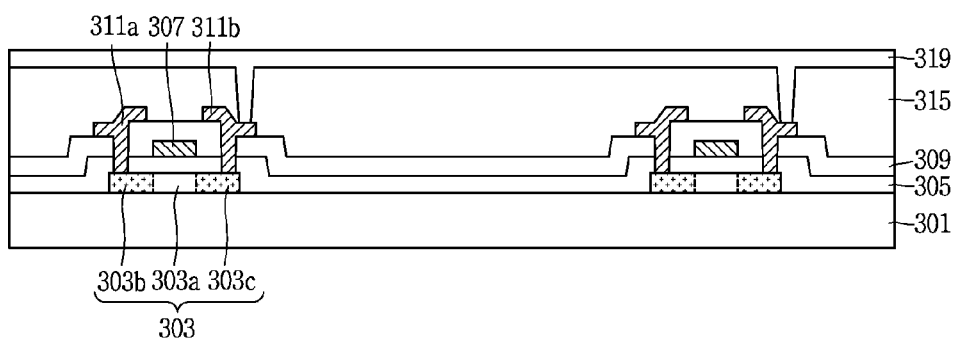
Figure 7D:
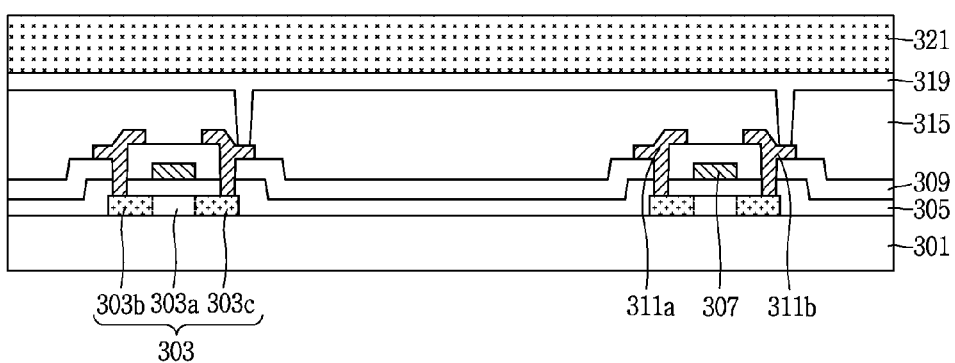
Figure 7E:
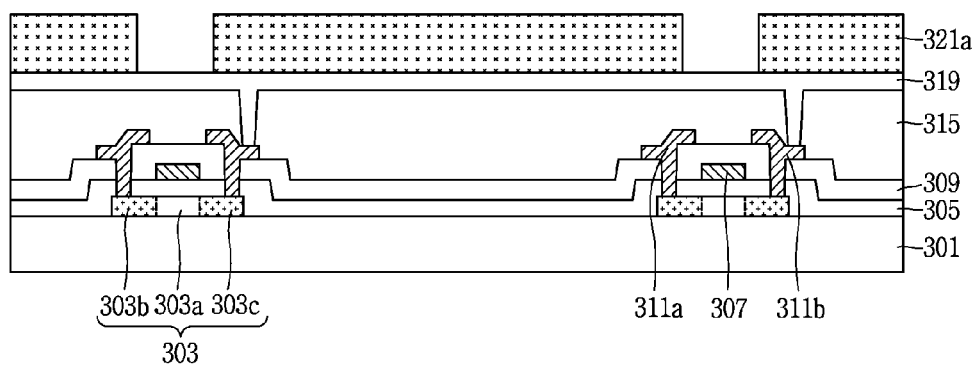
Figure 7F:
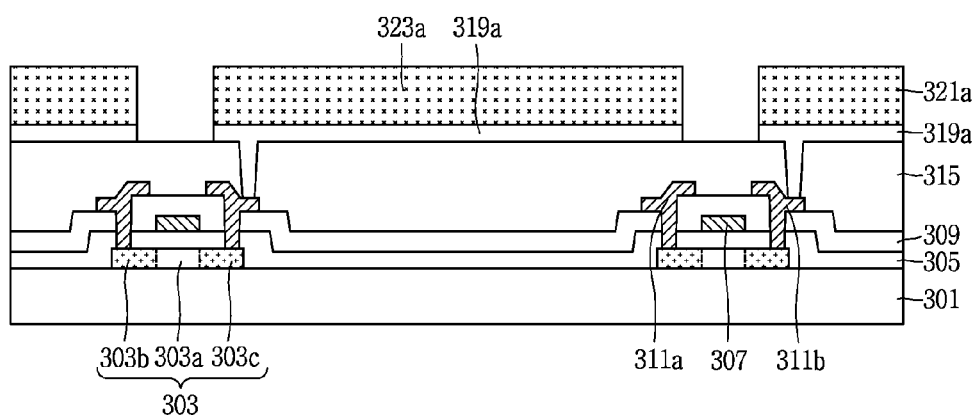
Figure 7G:
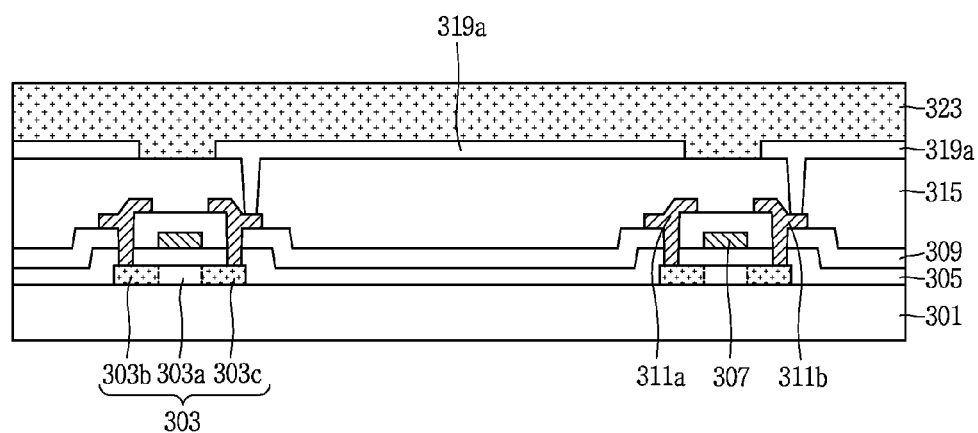
Figure 7H:
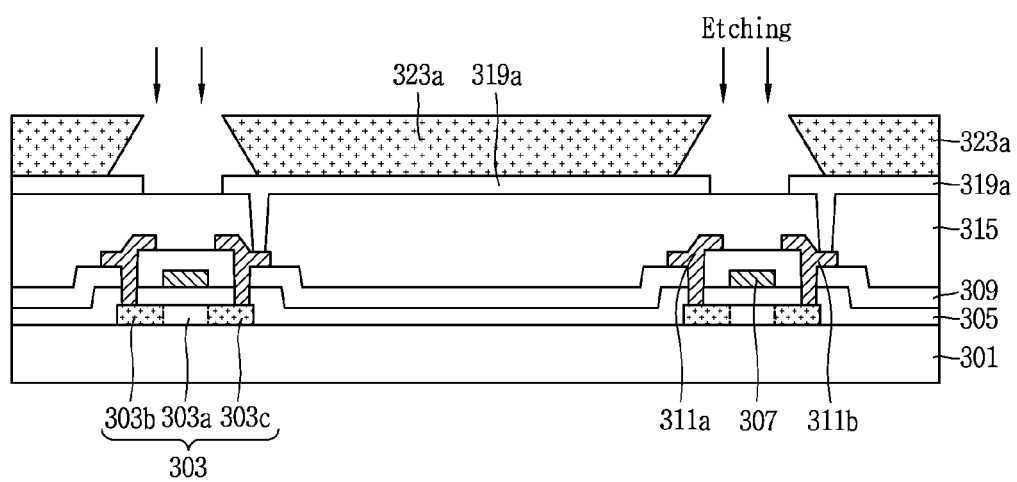
Figure 7I:
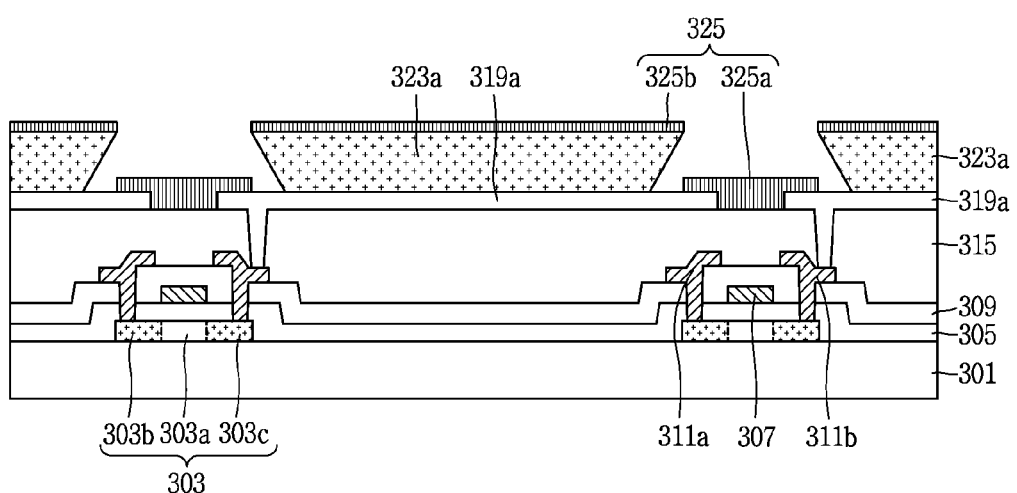
Figure 7J:
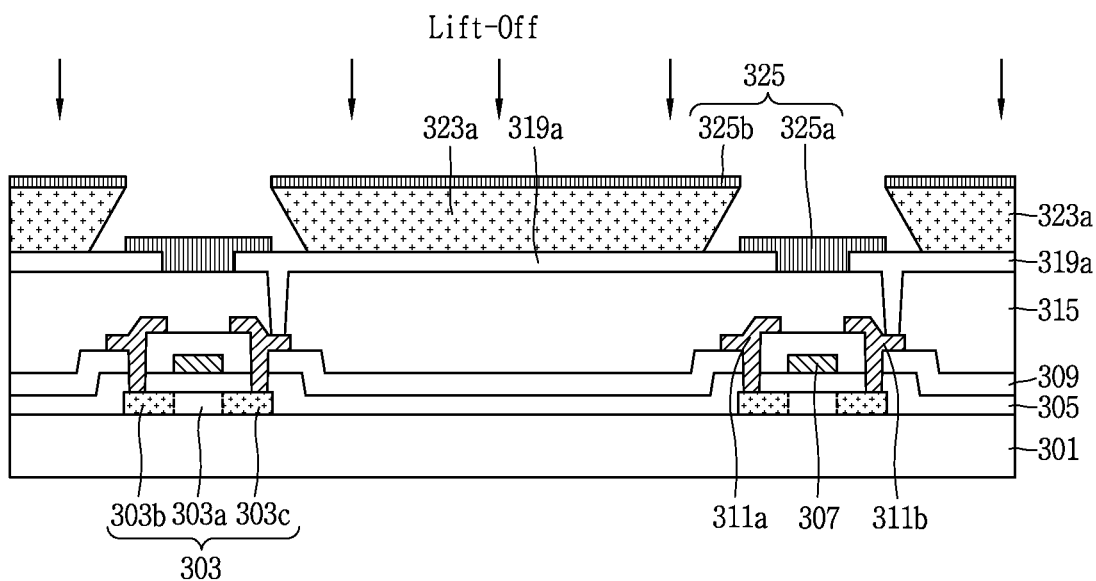
Figure 7K:
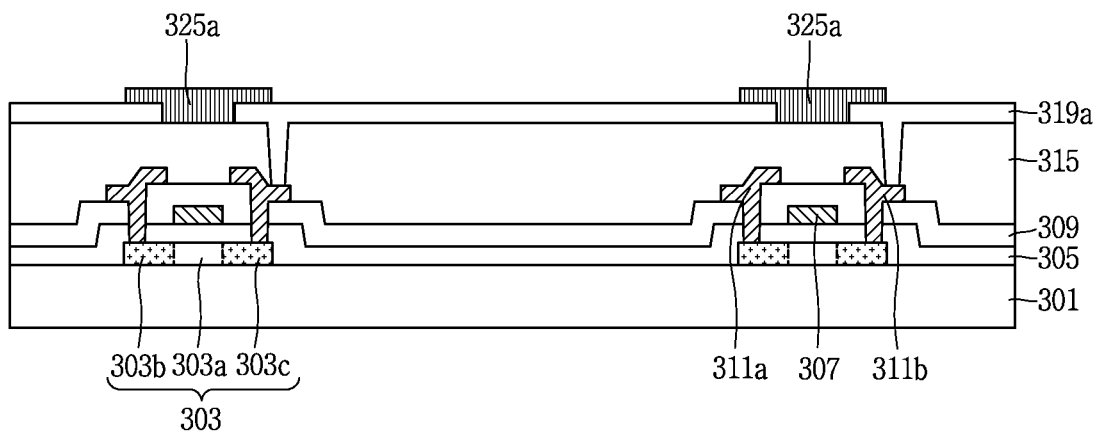
Figure 7L:
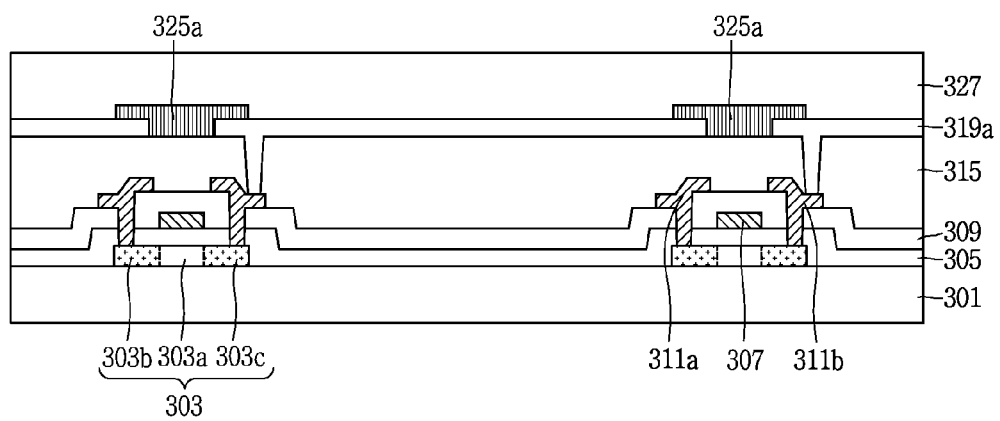
Figure 7M:
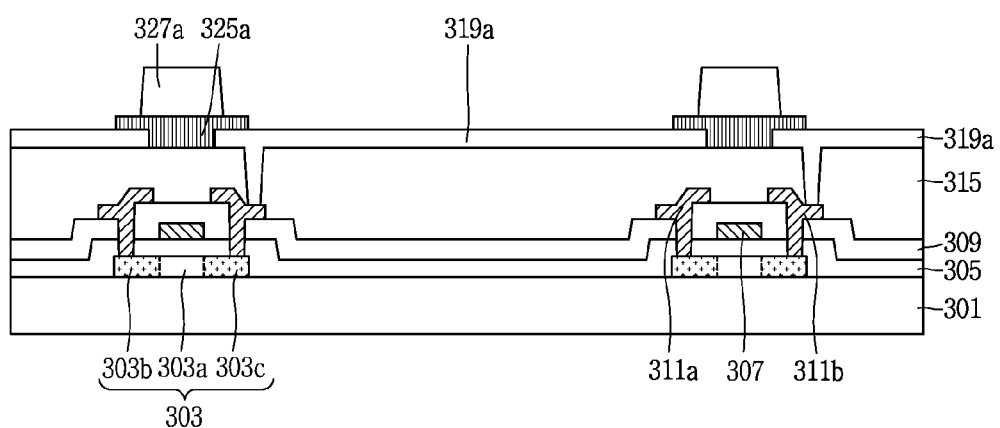
Figure 7N:
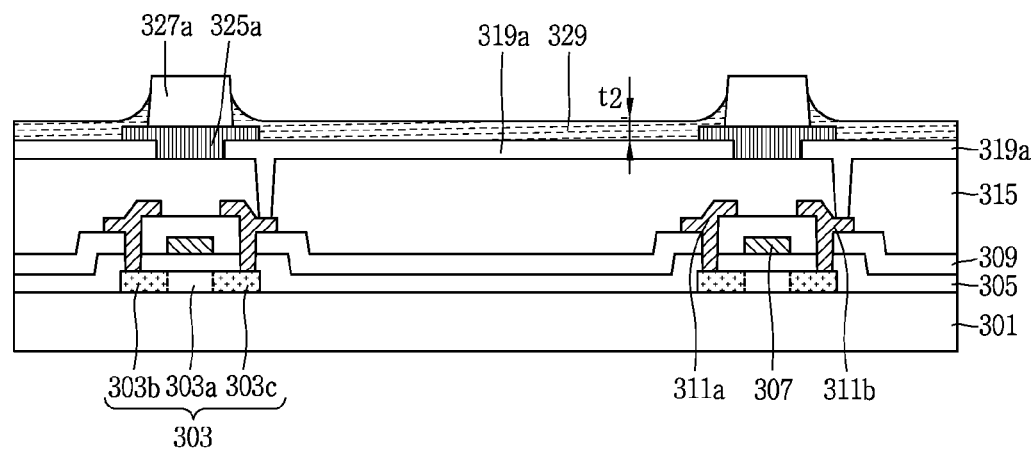
Figure 7O:
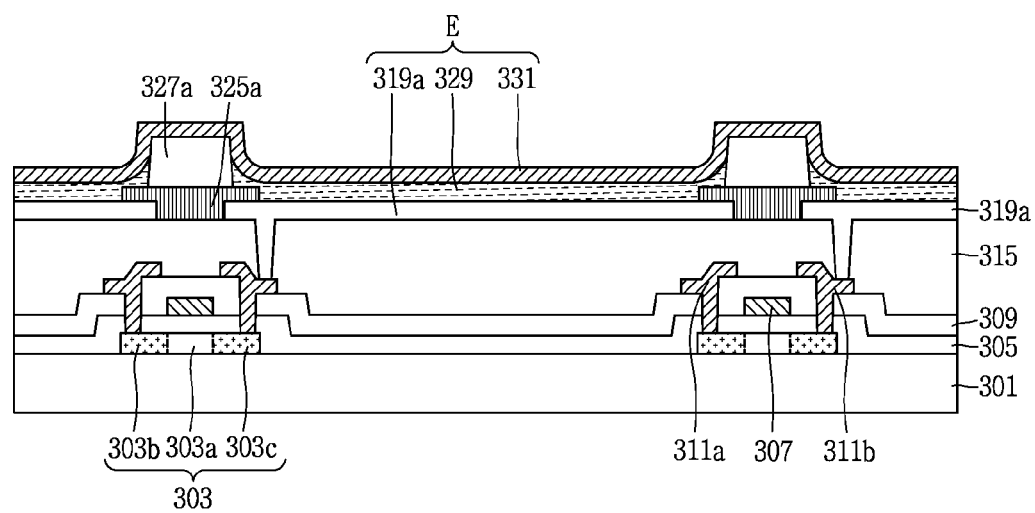

FIGS. 7A through 7O are fabrication process cross-sectional views illustrating a method for fabricating an organic electroluminescent device according to a third embodiment of the present invention.

Referring to FIG. 7A, first, a buffer layer (not shown) is formed on the substrate 301, and subsequently, an active layer 303 formed with a semiconductor material is provided on the buffer layer (not shown). Here, the active layer 303 formed on the substrate 301 may be selected and formed from an inorganic or organic semiconductor, and n-type or p-type impurities are doped in the source region 303b and drain region 303c, and a channel region 303a for connecting between the source region 303b and drain region 303c is provided therein.

An inorganic semiconductor forming the active layer 303 may include CdS, GaS, ZnS, CdSe, ZnSe, CdTe, SiC, and Si. Furthermore, an organic semiconductor forming the active layer 303 may include polythiophene and derivatives thereof, polyparaphenylene vinylene and derivatives thereof, polyparaphenylene and derivatives thereof, polyfluorene and derivatives thereof, polythiophene vinylene and derivatives thereof, polythiophene-heterocyclic aromatic copolymers and derivatives thereof as a high molecular substance, and may include oligoacene of pentacene, tetracene, naphthalene and derivatives thereof, oligothiophene of alpha-6-thiophene, alpha-5-thiophene and derivatives thereof, phthalocyanine containing or not containing a metal and derivatives thereof, pyromellitic dianhydride tick or pyromellitic diimide and derivatives thereof, perylene tetracarboxylic acid dianhydride or perylene tetracarboxylic diimide and derivatives thereof as a small molecular substance.

Next, a gate insulating layer 305 is formed to cover the active layer 303 on an entire surface of the substrate containing the active layer 303.

Subsequently, a gate electrode 307 is formed at an upper portion of the gate insulating layer 305. Here, the gate electrode 307 is connected to a gate line (not shown) applying an on/off signal of the thin film transistor (T). Here, the gate electrode 307 may be formed of a conductive metal layer such as MoW, Al, Cr, Al/Cu or the like, but may not be necessarily limited to them, and various conductive materials such as a conductive polymer or the like may be used for the gate electrode 307. The gate electrode 307 is formed to cover a region corresponding to the channel region 303a of the active layer 303.

Next, an interlayer insulating layer 309 is formed to cover the gate electrode 307 on an entire surface of the substrate containing the gate electrode 307.

Subsequently, a contact hole (not shown) for exposing the source region 303b and drain region 303c of the active layer 303 is formed on the interlayer insulating layer 309 and the gate insulating layer 305 at a lower portion thereof.

Next, the source electrode 311a and drain electrode 311b brought into contact with the source region 303b and drain region 303c, respectively, of the active layer 303 are formed through a contact hole (not shown) formed on the gate insulating layer 305 and interlayer insulating layer 309 on the interlayer insulating layer 309. Here, the source electrode 311a and drain electrode 311b may be formed of a conductive metal layer such as MoW, Al, Cr, Al/Cu or the like similarly to the gate electrode 307, but may not be necessarily limited to them, and various conductive materials such as a conductive polymer or the like may be used for the source electrode 311a and drain electrode 311b. The source electrode 311a and drain electrode 311b are formed to be separated from each other by the channel region 303a of the active layer 303.

Subsequently, referring to FIG. 7B, a passivation layer 315 made of $SiO_2$, SiNx or the like is formed at an upper portion of the source electrode 311a and drain electrode 311b. Here, the passivation layer 315 may perform the role of a protective layer for protecting the thin film transistor (T), and perform the role of a planarization layer for planarizing the upper surface thereof.

Next, a drain contact hole 317 for exposing the drain electrode 311b on the passivation layer 315 is formed through a mask process.

Subsequently, referring to FIGS. 7C and 7D, a first electrode forming conductive material layer 319 becoming an anode electrode of the organic light emitting device (E) is formed at an upper portion of the passivation layer 315, and a first photosensitive layer 321 is coated thereon. Here, the conductive material layer 319 may be provided with a transparent electrode and a reflective electrode, and thus may be provided with ITO, IZO, ZnO, or $In_2O_3$ when used as a transparent electrode, and a reflective layer may be formed of Ag, Mg, Al, Pt, Pd, Au, Ni, Nd, Ir, Cr, and compounds thereof and then ITO, IZO, ZnO, or $In_2O_3$ may be formed thereon when used as a reflective electrode.

Next, referring to FIG. 7E, subsequent to implementing a first exposure process using a first exposure mask (not shown), a light irradiation portion of the first photosensitive layer 321 is removed through a first development process to form a first photoresist pattern 321a.

Subsequently, referring to FIG. 7F, the conductive material layer 319 is selectively etched using the first photoresist pattern 321a as an etch mask to form the first electrode 319a electrically connected to the drain electrode 311b. Here, the first electrode 319a performs the function of an anode electrode, and a second electrode 331 which will be described later performs the function of a cathode electrode, but the first electrode 319a and second electrode 331 may be allowed to have opposite polarities to each other.

Subsequently, referring FIG. 7G, the remaining first photoresist pattern 321a is removed, and a second photosensitive layer 323 is coated on an entire surface of the substrate containing the first electrode 319a.

Next, referring FIG. 7H, light is irradiated on the second photosensitive layer 323 through a second exposure process using the first exposure mask (not shown) and then a portion irradiated with light is removed by a second development process to form the second photosensitive layer 323 having an inverse tapered shape, thereby forming a second photoresist pattern 323a having an inverse tapered shape. Here, the second photoresist pattern 323a having an inverse tapered shape may be allowed by performing a second exposure process with about 100-150% with respect to exposure energy used in the first exposure process or performing a second development process with about 100-200% with respect to development time used in the first development process.

An inorganic material layer formed during the following process is not formed on an inclined surface of the second photoresist pattern 323a having an inverse tapered shape. Accordingly, the inclined surface of the second photoresist pattern 323a having an inverse tapered shape is exposed to the outside, thereby facilitating the infiltration of a stripper for photoresist removal.

Subsequently, referring to FIG. 7I, an inorganic material layer 325 is formed at high temperatures between about 220 and 300 degrees, for example, on an entire surface of the substrate containing the second photoresist pattern 323a. Here, the inorganic material layer 325 may be formed of an inorganic material selected from $SiO_2$, SiNx, $Al_2O_3$, CuOx, $Tb_4O_7$, $Y_2O_3$, $Nb_2O_5$, $Pr_2O_3$ and the like having an insulating characteristic. Furthermore, the inorganic material layer 325 may be formed using a sputter method, a chemical vapor deposition (CVD) method, a deposition method or the like. The inorganic material layer 325 may include a remaining pattern portion (i.e., a first pixel define layer in the following process) 325a located between the adjoining first electrodes 319a containing an upper edge portion of the first electrode 319a and a sacrificial pattern portion 325b formed on a surface of the second photoresist pattern 323a.

Then, since the inorganic material layer 325 is formed at high temperatures between about 220 and 300 degrees, the volume of the second photoresist pattern 323a is increased and as a result, a crack (C) is generated on a surface of the sacrificial pattern portion 325b of the inorganic material layer 325 formed on a surface of the first photoresist pattern 321a, and the surface of the first photoresist pattern 321a is exposed to the outside due to the crack, thereby facilitating the infiltration of a stripper for photoresist removal during the following process. Furthermore, as described above, an inclined surface of the second photoresist pattern 323a having an inversed tapered shape is exposed to the outside, thereby facilitating the infiltration of a stripper for photoresist removal.

Next, referring to FIGS. 7J and 7K, the second photoresist pattern 323a is removed while at the same time removing the sacrificial pattern portion 325b of the inorganic material layer 325 formed on a surface of the second photoresist pattern 323a, and as a result, the first pixel define layer 325a is formed between the adjoining first electrodes 319a containing an upper edge portion of the first electrode 319a. Here, the first pixel define layer 325a is made of a hydrophilic inorganic material.

Subsequently, referring to FIG. 7L, an organic material layer 327 is formed on an entire surface of the substrate containing the first pixel define layer 325a. Here, the organic material layer 327 as a hydrophobic organic substance having an insulating characteristic may be formed of one selected from a group consisted of polyacryl, polyimide, polyamide (PA), benzocyclobutene (BCB), and phenolic resin. The organic material layer 327 may be formed using a coating method such as spin coating, slot coating or the like.

Next, referring to FIG. 7M, the organic material layer 327 is selectively patterned through an exposure and development process using a mask to form the second pixel define layer 327a made of a hydrophobic organic material on the first pixel define layer 325a. Here, the second pixel define layer 327a has a smaller width than that of the first pixel define layer 325a, but is not formed on an upper surface excluding an upper edge portion of the first pixel define layer 325a. The first and the second pixel define layer 325a, 327a denote patterned insulating layers performing the role of more accurately defining a light-emitting region in fabricating an organic light emitting device. Furthermore, the second pixel define layer 327a may be formed using a method such as ink-jet or the like.

Subsequently, referring to FIG. 7N, a soluble material or polymer-based liquid substance is injected between banks formed by the first and the second pixel define layer 325a, 327a, namely, on the first electrode 319a, and dried to form the organic layer 329. Here, the organic layer 329 may be formed using a printing technology such as ink-jet, nozzle printing or the like to reduce the mask process and enhance the pattern accuracy.

Here, the organic layer 329 may include a light-emitting layer (not shown). Here, the present invention may not be necessarily limited to such a structure, and various structures of the organic light emitting device may be applicable thereto as they are.

A low or high molecular organic layer may be used for the organic layer 329, and when a low molecular organic layer is used, a hole injection layer (HIL), a hole transport layer (HTL), an emission layer (EML), an electron transport layer (ETL), and an electron injection layer (EIL) and the like may be deposited and formed with a single or composite structure, and various materials including copper phthalocyanine (CuPc:), N,N'-Di(naphthalene-1-yl)-N,N'-diphenyl-benzidine (NPB), tris-8-hydroxyquinoline aluminum (Alq3) or the like may be applicable thereto. The low molecular organic layers may be formed using a vacuum deposition method.

In case of a high molecular organic layer, it may typically have a structure provided with the hole transport layer (HTL) and emission layer (EML), wherein PEDOT is used for the hole transport layer, and a poly-poly-phenylenevinylene (PPV)-based or polyfluorene-based high molecular organic material is used for the light-emitting layer, and it may be formed with screen printing, ink-jet printing or the like.

Such an organic layer may not be necessarily limited to this, and various embodiments may be, of course, applicable thereto.

On the other hand, an electron transport layer (ETL), which is a conductive material for connecting a current flow between the light-emitting material and the first electrode 319a, is used for a material initially printed on the first electrode 319a, and typically used a material such as PEDOT or the like. The substance is a material having properties such as water, and the printing aspect may vary according to the material properties of the pixel define layer. For example, the organic material is widely spread out to be well stuck thereto when the pixel define layer is a hydrophilic substance, whereas the organic material is cohered in a round shape not to be stuck thereto when the pixel define layer is a hydrophobic substance.

According to the present invention, a bank is configured with a first electrode 319a made of a transparent conductive material such as hydrophilic ITO or the like, a first pixel define layer 325a made of a hydrophilic inorganic material, and a second pixel define layer 327a made of a hydrophobic organic material. In other words, the first pixel define layer 325a and first electrode 319a are hydrophilic such that an organic material is well stuck thereto, and the second pixel define layer 327a is hydrophobic such that an organic material is well gathered only within a pixel, and thus the organic material is well placed on the first electrode 319a subsequent to the drying process.

Accordingly, an item occupying the largest proportion of organic layer patterning process failures using a printing technology is an edge failure, and a thickness variation is generated within the organic layer while an edge region of the organic layer within the pixel is drawn up during the drying process of the organic layer while forming a pixel define layer having an existing single structure, thereby causing a failure in the edge region of the pixel.

However, according to the present invention, the first pixel define layer 325a made of an inorganic layer and the second pixel define layer 327a made of an organic layer are formed thereon to prevent a failure in the existing edge region of the pixel, and the first pixel define layer 325a is formed between the first electrodes 319a, and the second pixel define layer 327a is formed on an upper surface excluding an upper edge portion of the first pixel define layer 325a.

Accordingly, when the organic layer 329 is formed on the first electrode 319a, the first pixel define layer 325a and first electrode 319a are hydrophilic and thus organic materials are well stuck thereto, but the second organic pixel define layer 327a is hydrophobic and thus organic materials are well gathered only within the pixel, and accordingly, the organic materials are well placed on the first electrode 319a subsequent to the drying process, and as a result, a phenomenon in which an edge region on an organic layer within a pixel is drawn up a sidewall of the second pixel define layer 327a may be alleviated by the first pixel define layer 325a at a lower portion thereof during the drying process of the organic layer to maintain a thickness (t2) uniformity of the organic layer within the pixel region (P), thereby enhancing the light-emitting uniformity of the pixel.

Next, referring to FIG. 7O, the second electrode 331 is formed on an entire surface of the substrate containing the organic layer 329. Here, the second electrode 331 may be provided with a transparent electrode or reflective electrode, and the second electrode 331 may be used as a cathode electrode when used as a transparent electrode, and thus a metal with a small work function, such as Li, Ca, LiF/Ca, LiF/Al, Al, Ag, Mg, and compounds thereof, may be deposited in the direction of the organic layer 329, and then an auxiliary electrode layer or bus electrode line may be formed thereon with a transparent electrode forming materials such as ITO, IZO, ZnO, $In_2O_3$ or the like. Furthermore, Li, Ca, LiF/Ca, LiF/Al, Al, Ag, Mg, and compounds thereof may be deposited and formed on an entire surface thereof when used as a reflective electrode.

Accordingly, an organic light emitting device (E) emits red, green and blue light according to the flow of a current to display a predetermined image information, which is provided with a first electrode 319a connected to the drain electrode 311b of the thin film transistor to supply plus power therefrom, a second electrode 331 provided to cover the entire pixel to supply minus power therefrom, and an organic layer 329 disposed between the first electrode 319a and second electrode 331 to emit light.

The first electrode 319a and second electrode 331 are insulated from each other through the organic layer 329, and voltages having different polarities are applied to the organic layer 329, thereby emitting light.

As described above, the process of a method for fabricating an organic light emitting device according to a third embodiment of the present invention will be completed.

According to a method for fabricating an organic light emitting device in accordance with a third embodiment of the present invention, a first pixel define layer may be formed through a lift-off process and thus a dry etching or wet etching process may be omitted to minimize a damage on an ITO surface or lower layer of the first electrode similarly to the foregoing first embodiment, thereby enhancing the light-emitting uniformity and lifespan of the pixel.

Furthermore, according to a method for fabricating an organic light emitting device in accordance with a third embodiment of the present invention, a first pixel define layer may be formed through a lift-off process and thus a dry etching or wet etching process may be omitted to reduce the number of fabrication processes, thereby reducing the fabrication cost.

In addition, according to a method for fabricating an organic light emitting device in accordance with a third embodiment of the present invention, a phenomenon in which an edge region on an organic layer within a pixel is drawn up a sidewall of the upper pixel define layer may be alleviated by the pixel define layer at a lower portion thereof during the drying process of an organic layer formed through a soluble process to maintain a thickness (t2) uniformity of the organic layer within the pixel region (P), thereby enhancing the light-emitting uniformity of the pixel.

However, it may be understood by those skilled in the art that the foregoing present invention can be implemented in other specific forms without changing the technical concept and essential characteristics thereof.

Therefore, it should be understood that the foregoing embodiments are merely illustrative but not restrictive in all aspects. The scope of the present invention is defined by the appended claims rather than by the detailed description, and all changes or modifications derived from the meaning, scope and equivalent concept of the claims should be construed to be embraced by the scope of the present invention.

What is claimed is:

1. An organic light emitting device, comprising:
a thin film transistor disposed on a substrate;
a first electrode formed for each pixel on the thin film transistor;
a first pixel define layer formed to cover an edge portion of the first electrode;
a second pixel define layer formed wholly on an upper surface of the first pixel define layer excluding an upper edge portion of the first pixel define layer, wherein a width of the second pixel define layer is smaller than a width of the first pixel define layer;
an organic layer formed on the first electrode; and
a second electrode formed on the organic layer.

2. The organic light emitting device of claim 1, wherein the first pixel define layer contains an inorganic material, and the second pixel define layer contains an organic material.

3. The organic light emitting device of claim 1, wherein the first pixel define layer contains a hydrophilic material, and the second pixel define layer contains a hydrophobic material.

4. The organic light emitting device of claim 1, wherein a portion of the organic layer is formed directly on and contacting the upper edge portion of the first pixel define layer.

5. An organic light emitting device, comprising:
a thin film transistor disposed on a substrate;
a first electrode formed for each pixel on the thin film transistor;
a first pixel define layer formed to cover an edge portion of the first electrode;
a second pixel define layer formed wholly on an upper surface of the first pixel define layer excluding an upper edge portion of the first pixel define layer;
an organic layer formed on the first electrode and the upper edge portion of the first pixel define layer;
a second electrode formed on the organic layer,
wherein an opening width between the second pixel define layer defining a pixel region is greater than an opening width between the first pixel define layer defining the pixel region.

6. The organic light emitting device of claim 5, wherein the first pixel define layer contains an inorganic material, and the second pixel define layer contains an organic material.

7. The organic light emitting device of claim 5, wherein the first pixel define layer contains a hydrophilic material, and the second pixel define layer contains a hydrophobic material.

8. The organic light emitting device of claim 5, wherein a width of the second pixel define layer is smaller than a width of the first pixel define layer.

9. The organic light emitting device of claim 5, wherein a portion of the organic layer is formed over a lateral surface of the second pixel define layer and the upper edge portion of the first pixel define layer.

10. The organic light emitting device of claim 5, wherein the organic layer contacts a sidewall of the second pixel define layer.

11. The organic light emitting device of claim 9, wherein the portion of organic layer contacts the sidewall of the second pixel define layer and the upper edge portion of the first pixel define layer is nonluminous area.

12. The organic light emitting device of claim 5, wherein the organic layer includes a luminous area and a nonluminous area.

* * * * *